(12) United States Patent
Shim et al.

(10) Patent No.: US 12,041,348 B2
(45) Date of Patent: *Jul. 16, 2024

(54) IMAGE SENSOR INCLUDING PLURALITY OF AUTO FOCUSING PIXEL GROUPS

(71) Applicant: SAMSUNG ELECTRONICS CO., LTD., Suwon-si (KR)

(72) Inventors: Eunsub Shim, Hwaseong-si (KR); Kyungho Lee, Suwon-si (KR); Masato Fujita, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/138,762

(22) Filed: Apr. 25, 2023

(65) Prior Publication Data
US 2023/0262329 A1    Aug. 17, 2023

Related U.S. Application Data

(63) Continuation of application No. 17/941,302, filed on Sep. 9, 2022, now Pat. No. 11,671,705, which is a (Continued)

(30) Foreign Application Priority Data

Oct. 22, 2019    (KR) .................. 10-2019-0131686

(51) Int. Cl.
*H04N 23/67*    (2023.01)
*G03B 13/16*    (2021.01)
*H01L 27/146*   (2006.01)

(52) U.S. Cl.
CPC ............. *H04N 23/67* (2023.01); *G03B 13/16* (2013.01); *H01L 27/14612* (2013.01); *H01L 27/14627* (2013.01); *H01L 27/14647* (2013.01)

(58) Field of Classification Search
CPC .... H04N 23/67; H04N 23/667; H04N 23/672; H04N 25/704; H04N 25/77; H04N 25/75;
(Continued)

(56) References Cited

U.S. PATENT DOCUMENTS

| 7,714,890 B2 | 5/2010 | Okubo et al. |
| 8,964,079 B2 | 2/2015 | Fukuda et al. |

(Continued)

FOREIGN PATENT DOCUMENTS

| JP | 2018-004689 A | 1/2018 |
| JP | 2018-160933 A | 10/2018 |

*Primary Examiner* — Shahbaz Nazrul
(74) *Attorney, Agent, or Firm* — Sughrue Mion, PLLC

(57) ABSTRACT

An image sensor according to an example embodiment include a plurality of image pixel groups, a plurality of auto focusing (AF) pixel groups, a first transmission control signal line connected to a first pixel of each of the plurality of image pixel groups, a second transmission control signal line connected to a second pixel of each of the plurality of image pixel groups, a third transmission control signal line connected to a first pixel of each of the plurality of AF pixel groups, and a fourth transmission control signal line connected to a second pixel of each of the plurality of AF pixel groups, wherein the fourth transmission control signal line is electrically separated from the first to the third transmission control signal line, and the each of the plurality of image pixel group and the plurality of AF pixel groups are disposed below a single microlens.

20 Claims, 22 Drawing Sheets

Related U.S. Application Data continuation of application No. 16/941,813, filed on Jul. 29, 2020, now abandoned.

(58) Field of Classification Search
CPC ...... H04N 25/42; H04N 25/585; G03B 13/16; H01L 27/14612; H01L 27/14627; H01L 27/14647; H01L 27/14603; H01L 27/14641; H01L 27/14643; H01L 27/14609

See application file for complete search history.

(56) References Cited

U.S. PATENT DOCUMENTS

| | | | |
|---|---|---|---|
| 9,237,281 B2 | 1/2016 | Fukuda | |
| 9,288,382 B2 | 3/2016 | Fujii et al. | |
| 9,491,442 B2 | 11/2016 | Kim | |
| 9,818,781 B2 | 11/2017 | Lee et al. | |
| 9,935,141 B2 | 4/2018 | Kimura | |
| 10,014,338 B2 | 7/2018 | Lee | |
| 10,270,996 B2 | 4/2019 | Lee | |
| 10,284,799 B2 | 5/2019 | Yokogawa et al. | |
| 10,431,619 B2 | 10/2019 | Masagaki et al. | |
| 11,190,716 B2 * | 11/2021 | Kim | H04N 25/704 |
| 2016/0353017 A1 | 12/2016 | Kim et al. | |
| 2018/0343404 A1 * | 11/2018 | Hwang | H04N 25/59 |
| 2018/0352199 A1 * | 12/2018 | Hwang | H04N 9/01 |
| 2020/0328238 A1 * | 10/2020 | Shim | H01L 27/1461 |
| 2020/0358971 A1 * | 11/2020 | Shim | H04N 25/445 |
| 2022/0078364 A1 * | 3/2022 | Kim | H04N 25/745 |
| 2022/0328548 A1 * | 10/2022 | Lee | H04N 25/46 |

* cited by examiner

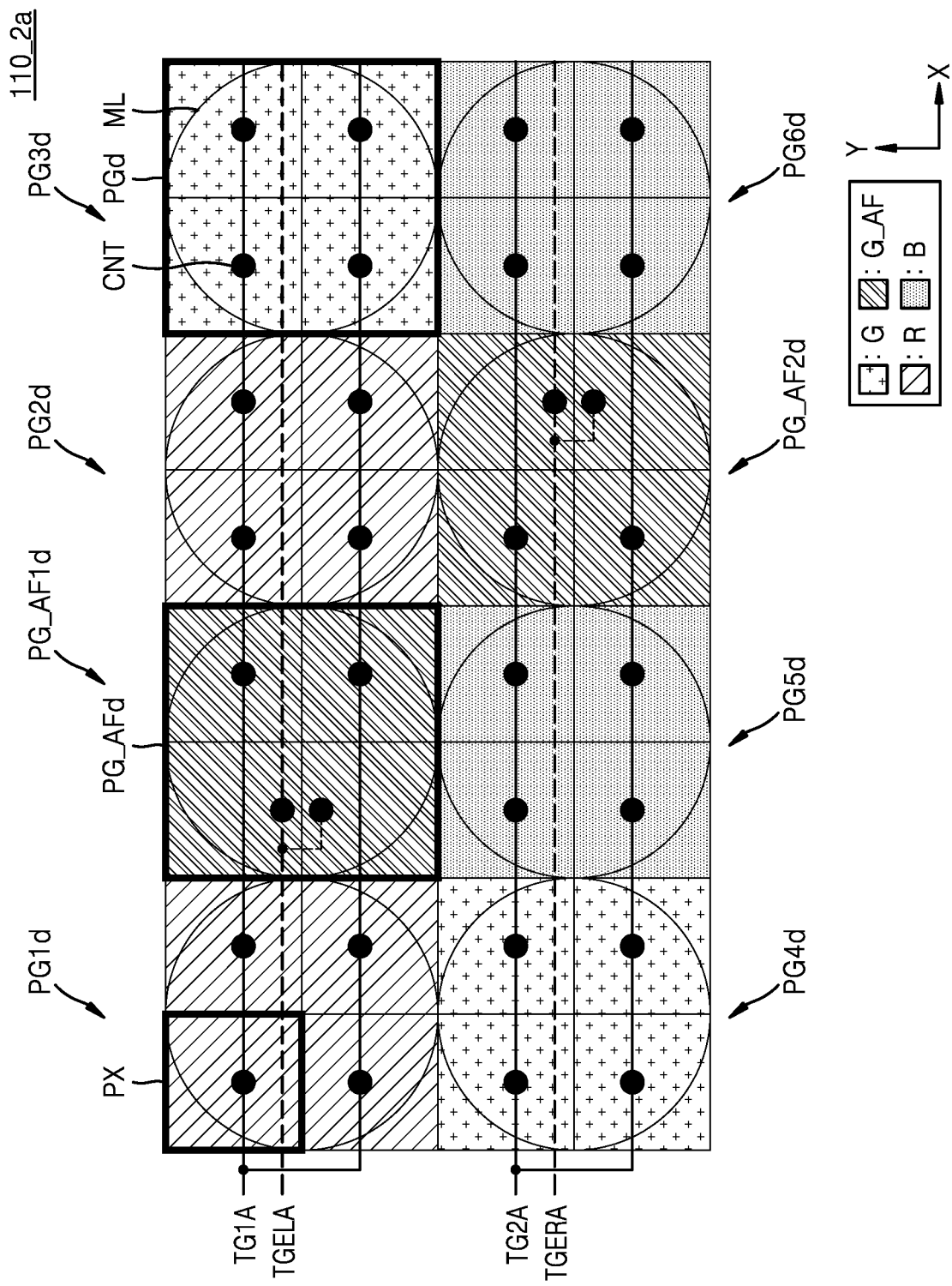

IMAGE SENSOR INCLUDING PLURALITY OF AUTO FOCUSING PIXEL GROUPS

CROSS-REFERENCE TO RELATED APPLICATIONS

This application is a Continuation of U.S. application Ser. No. 17/941,302, filed on Sep. 9, 2022, which is a Continuation of U.S. application Ser. No. 16/941,813, filed on Jul. 29, 2020, which claims priority from Korean Patent Application No. 10-2019-0131686, filed on Oct. 22, 2019 in the Korean Intellectual Property Office, the disclosures of which are incorporated herein by reference in their entirety.

BACKGROUND

Apparatuses and methods consistent with one or more exemplary embodiments relate to an image sensor, and more particularly, to an image sensor including a plurality of auto focusing (AF) pixel groups.

An image sensor that captures an image and converts the image into an electrical signal is used in a consumer electronic device, such as a digital camera, a mobile phone camera, or a portable camcorder, as well as a camera mounted in an automobile, a security device, or a robot. The image sensor includes a pixel array, and each pixel included in the pixel array may include a photodiode. The image sensor needs to perform an AF function such that an image may be accurately captured in a short time.

SUMMARY

Aspects of one or more exemplary embodiments provide an image sensor capable of quickly performing an AF function.

According to an aspect of an exemplary embodiment, there is provided an image sensor including: a pixel array including a plurality of image pixel groups and a plurality of auto focusing (AF) pixel groups, each of the plurality of image pixel groups and the plurality of AF pixel groups including a plurality of pixels; a first transmission control signal line connected to a first pixel of each of the plurality of image pixel groups; a second transmission control signal line connected to a second pixel of each of the plurality of image pixel groups; a third transmission control signal line connected to a first pixel of each of the plurality of AF pixel groups; and a fourth transmission control signal line connected to a second pixel of each of the plurality of AF pixel groups, wherein the fourth transmission control signal line is electrically separated from the first to the third transmission control signal line, and wherein the each of the plurality of image pixel group and the plurality of AF pixel groups are disposed below a single microlens.

According to an aspect of another exemplary embodiment, there is provided an image sensor including: a pixel array including a plurality of pixels on a first row in a first direction and a plurality pixels arranged on a second row in the first direction, the second row being arranged next to the first row in a second direction perpendicular to the first direction, the plurality of pixels on the first row including a first to an eighth pixels, the plurality of pixels on the second row including a first to an eighth pixels; and a first transmission control signal line connected to the first pixel, the fifth pixel, and the seventh pixel among the plurality of pixels on the first row, wherein the first pixel, the fifth pixel, and the seventh pixel among the plurality of pixels on the first row are sequentially arranged in the first direction, wherein each of the plurality of pixels on the first row is included in a corresponding pixel group among a plurality pixel group, and each of the plurality of pixel group is disposed below a single microlens.

According to an aspect of another exemplary embodiment, there is provided an image sensor including: a pixel array including a plurality of first pixels on a first row in a first direction and a plurality of second pixels arranged on a second row in the first direction, the second row being arranged next to the first row in a second direction perpendicular to the first direction; a first transmission control line connected to N numbers of pixels of the plurality of first pixels; a second transmission control line connected to M numbers of pixels of the plurality of first pixels; a third transmission control line connected to K numbers of pixels of the plurality first pixels, wherein each of the plurality of pixels on the first row is included in a corresponding pixel group among a plurality pixel group, and each of the plurality of pixel group is disposed below a single microlens, wherein the N, the M and the K are integer, and the K is less than or equal to ⅓ of each of the N and the M.

BRIEF DESCRIPTION OF THE DRAWINGS

Embodiments will be more clearly understood from the following detailed description taken in conjunction with the accompanying drawings in which:

FIGS. 9A and 9B are diagrams illustrating another exemplary connection between the row driver and the pixel array of FIG. 2;

DETAILED DESCRIPTION

Figure 1:
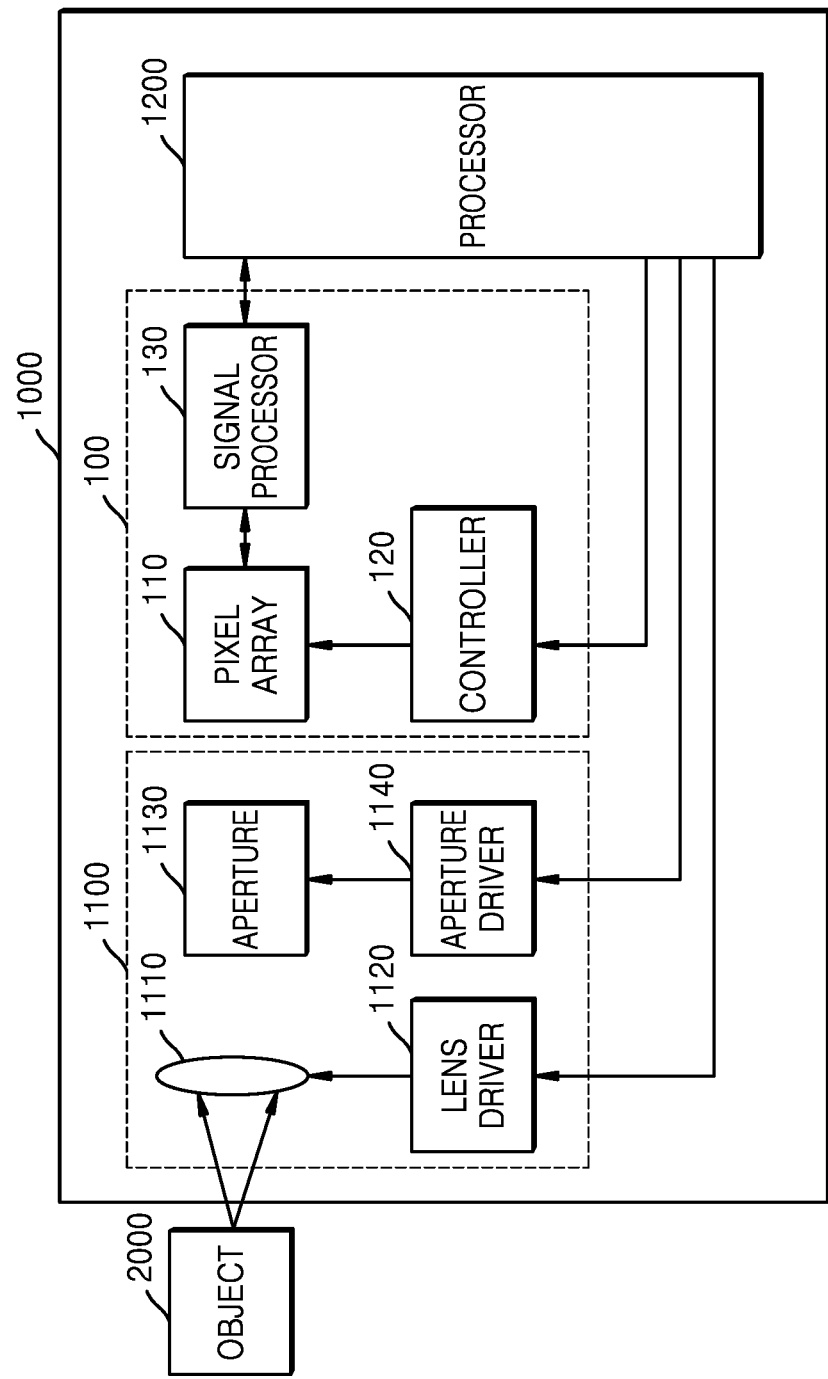
FIG. 1 is a diagram illustrating a structure of a digital imaging device according to an exemplary embodiment.

FIG. 1 is a diagram illustrating a structure of a digital imaging device 1000 according to an exemplary embodiment.

Referring to FIG. 1, the digital imaging device 1000 according to the exemplary embodiment may include an imaging unit 1100, an image sensor 100, and a processor 1200. The digital imaging device 1000 may have a focus detection function.

Operations of the digital imaging device 1000 may be controlled by the processor 1200. The processor 1200 may provide a control signal for an operation of each component to a lens driver 1120, an aperture driver 1140, a controller 120, and so on.

The imaging unit 1100 may be a configuration element for receiving light and may include a lens 1110, the lens driver 1120, an aperture 1130, and the aperture driver 1140. The lens 1110 may include a plurality of lenses.

The lens driver 1120 may transmit and receive information on focus detection to and from the processor 1200 and adjust a position of the lens 1110 according to a control signal provided from the processor 1200. The lens driver 1120 may move the lens 1110 in a direction in which a distance to an object 2000 increases or decreases, and a distance between the lens 1110 and the object 2000 may be adjusted. The object 2000 may be focused or blurred depending on the position of the lens 1110.

The image sensor 100 may convert incident light into an image signal. The image sensor 100 may include a pixel array 110, the controller 120, and a signal processor 130. An optical signal transmitted through the lens 1110 and the aperture 1130 may reach a light receiving surface of the pixel array 110 to form an image of a subject (i.e., the object 2000).

The pixel array 110 may be a complementary metal oxide semiconductor image sensor (CIS) that converts an optical signal into an electrical signal. Sensitivity and the like of the pixel array 110 described above may be adjusted by the controller 120. The pixel array 110 may include pixels for performing at least one of an auto focusing (AF) function or a distance measurement function.

The image sensor 100 may provide an image signal to the processor 1200, and the processor 1200 may perform a phase difference calculation by using the image signal. The processor 1200 may obtain at least one of a position of focus, a direction of the focus, a distance between the object 2000 and the image sensor 100, etc., from a result of the phase difference calculation. The processor 1200 may output a control signal to the lens driver 1120 to move the position of the lens 1110 based on the result(s) of the phase difference calculation.

In the present exemplary embodiment, the image sensor 100 may perform AF operations of a first mode and a second mode. For example, in the first mode, the image sensor 100 may provide an image signal including AF information to the processor 1200 based on a pixel signal output from each of pixels included in the pixel array 110. In the second mode, the image sensor 100 may provide an image signal including the AF information to the processor 1200 based on pixel signals output from the pixels included in a plurality of AF pixel groups among a plurality of pixel groups and the plurality of AF pixel groups included in the pixel array 110.

The image sensor may be configured to provide a high resolution AF function in the first mode or provide a high speed AF function in the second mode, thereby efficiently providing the AF function in various situations. It is understood that one or more other exemplary embodiments are not limited thereto, and in another exemplary embodiment, the image sensor 100 may not operate in the first mode but may perform only the AF operation of the second mode.

Figure 2:
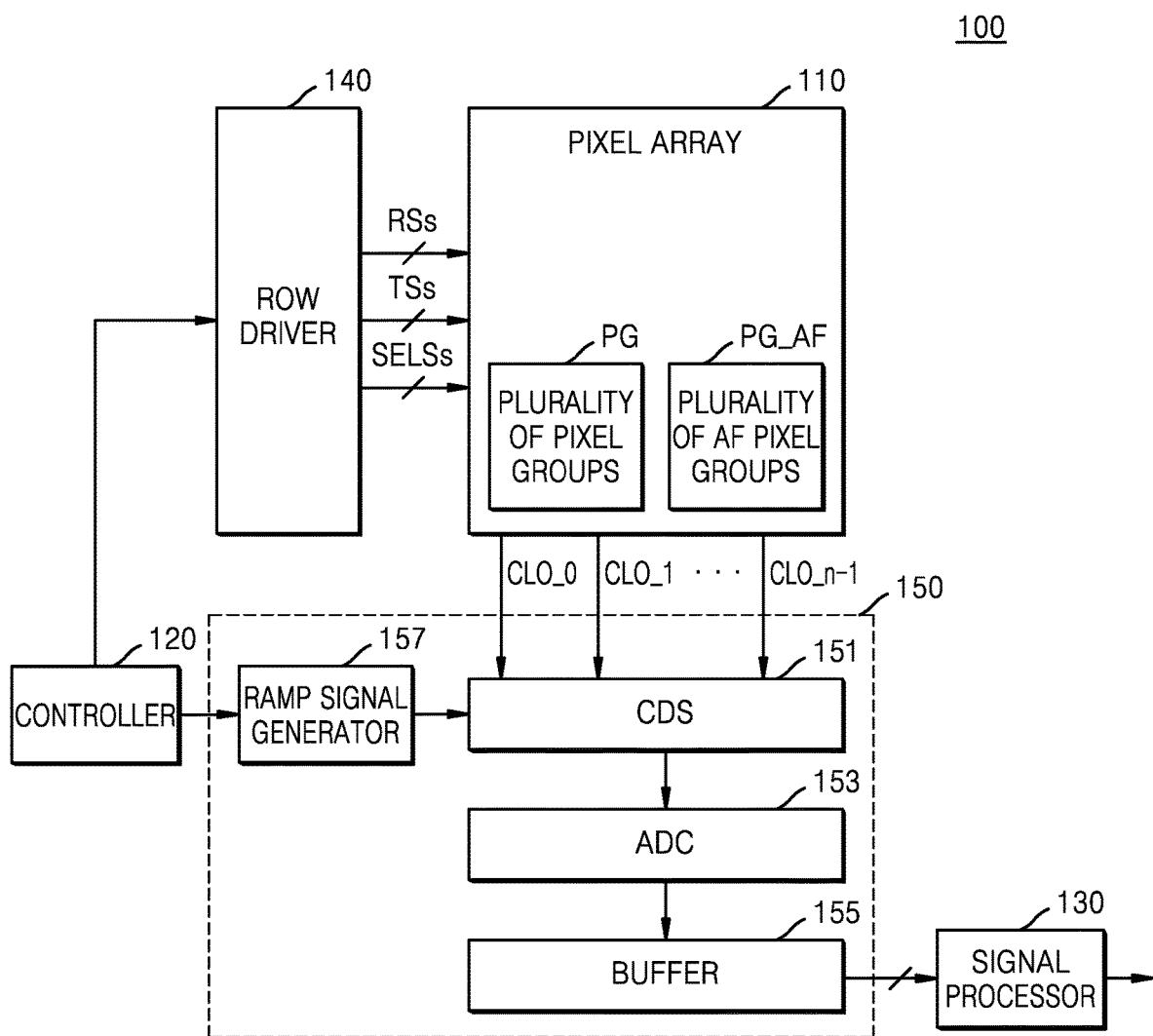
FIG. 2 is a block diagram illustrating a configuration of an image sensor according to another exemplary embodiment.

FIG. 2 is a block diagram illustrating a configuration of an image sensor 100 according to an exemplary embodiment.

Referring to FIG. 2, the image sensor 100 may include the pixel array 110, the controller 120, the signal processor 130, a row driver 140, and a signal reader 150. The signal reader 150 may include a correlated-double sampling circuit (CDS) 151, an analog-to-digital converter (ADC) 153, and a buffer 155.

The pixel array 110 may include a plurality of pixel groups PG (for example, PX of FIG. 3), each including a plurality of pixels, and a plurality of AF pixel groups PG_AF. A ratio of the plurality of AF pixel groups PG_AF to the plurality of pixel groups PG in the pixel array 110 may be adjusted in various ways. A structure of the plurality of pixels PX included in the pixel array 110 is described below with reference to FIGS. 3 to 5, 6A to 6B, 7 to 8, 9A to 9B, 10A to 10C, 11A to 11B, 12A to 12C, and 13A to 13C. In this case, each of the plurality of pixel groups PG which are different from the plurality of AF pixel groups PG_AF may be referred to as an image pixel group.

The pixel array 110 may output the pixel signals to a CDS 151 through first through n-th column output lines CLO_0 to CLO_n−1. In the present exemplary embodiment, the pixel signals output from a plurality of pixels PX included in each of the plurality of pixel groups PG and the plurality of AF pixel groups PG_AF may be phase signals used to calculate a phase difference in the first mode. In addition, in the second mode, the pixel signals output from some selected pixels among the plurality of pixels PX included in each of the plurality of AF pixel groups PG_AF may be the phase signals used to calculate the phase difference. The phase signals may include information on positions of images formed in the image sensor 100, and a focal position of the lens 1110 of FIG. 1 may be calculated based on the calculated phase difference. For example, the position of the lens 1110 of FIG. 1 that makes the phase difference zero may be the focal position.

That is, in the first mode, the pixel signals output from each of the plurality of pixel groups PG and the plurality of AF pixel groups PG_AF may include AF information. In contrast to this, in the second mode, the pixel signals output from each of the plurality of AF pixel groups PG_AF may include the AF information, and the pixel signals output from the plurality of pixel groups PG may not include the AF information.

The phase signals may be used not only to focus on the object 2000, but also to measure a distance between the object 2000 and the image sensor 100. In order to measure the distance between the object 2000 and the image sensor 100, additional information may be referred to, such as at least one of the phase difference between the images formed in the image sensor 100, a distance between the lens 1110 and the image sensor 100, a size of the lens 1110, a focal position of the lens 1110, and so on.

The controller 120 may control the row driver 140 to make the pixel array 110 absorb light to accumulate charges or temporarily store the accumulated charges and to make the pixel array 110 output an electrical signal according to the stored charges to the outside. In addition, the controller 120 may control the signal reader 150 to measure a level of the pixel signal provided by the pixel array 110.

The row driver 140 may generate control signals RSs, TSs, and SELSs for controlling the pixel array 110 and provide the generated control signals to the pixel array 110. In the present exemplary embodiment, the row driver 140 may determine activation timing and deactivation timing of the reset control signals RSs, the transmission control signals TSs, and the selection signals SELSs provided to the respective pixels PX included in each of the plurality of pixel groups PG and the plurality of AF pixel groups PG_AF to perform the first mode or the second mode.

In the present exemplary embodiment, the row driver 140 may provide the transmission control signals TSs such that each of the plurality of pixels PX included in the plurality of pixel groups PG and the plurality of AF pixel groups PG_AF may generate the pixel signal as a phase signal in the first mode. In addition, in the second mode, the row driver 140 may provide the transmission control signals TSs to block generation of (or control not to generate) the pixel signal according to photo-charges converted by some pixels (e.g., some selected or predetermined pixels) among the plurality of pixels PX included in the plurality of AF pixel groups PG_AF. That is, in the second mode, as only other pixels (e.g., other selected or predetermined pixels) from among the plurality of pixels PX included in the plurality of AF pixel groups PG_AF are controlled to output the pixel signal as a phase signal, the image sensor 100 may have or obtain pixel signals including the AF information output from the plurality of AF pixel groups PG_AF, even when the pixel signals output from the plurality of pixel groups PG do not include the AF information. Accordingly, the image sensor 100 may perform the first mode to provide a high resolution AF function and may perform the second mode to provide a high speed AF function.

The CDS 151 may sample and hold the pixel signals provided by the pixel array 110. The CDS 151 may double-sample a level of a predetermined noise and a level according to a pixel signal and output a level corresponding to a difference therebetween. In addition, the CDS 151 may receive ramp signals generated by the ramp signal generator 157, compare the ramp signals with each other, and output comparison results. The analog-to-digital converter 153 may convert an analog signal corresponding to a level received from the CDS 151 into a digital signal. The buffer 155 may latch the digital signal, and the latched signal may be sequentially output to the outside of the signal processor 130 or the image sensor 100.

The signal processor 130 may perform signal processing based on the digital signal received from the buffer 155. For example, the signal processor 130 may perform at least one of noise reduction processing, gain adjustment, waveform shaping processing, interpolation processing, white balance processing, gamma processing, edge emphasis processing, and so on. In addition, the signal processor 130 may output the signal-processed image signal to the processor 1200 during the AF operation to perform a phase difference calculation for the AF operation. In the present exemplary embodiment, the signal processor 130 may be included in the processor 1200 of FIG. 1 outside the image sensor 100.

Figure 3:
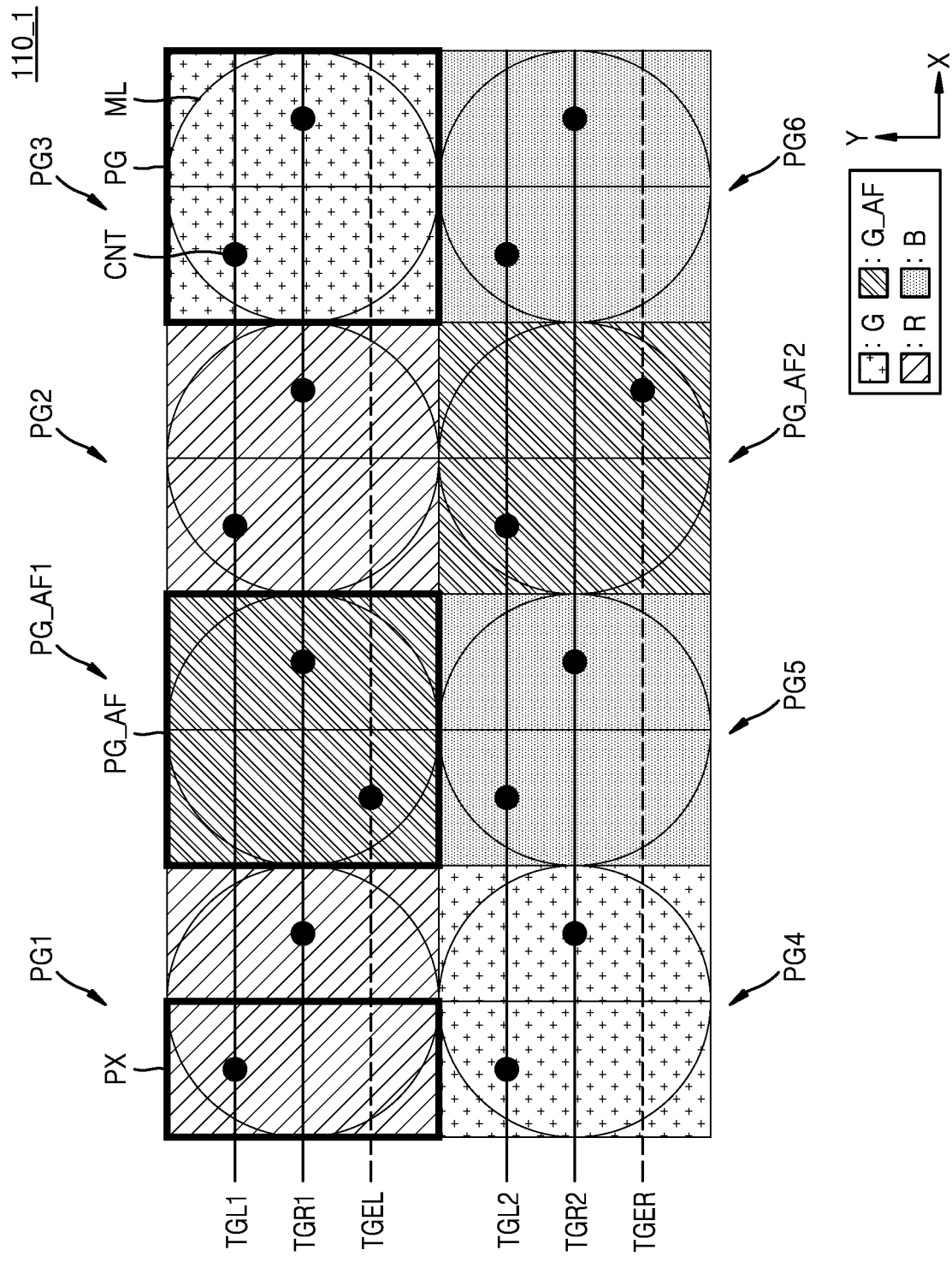
FIG. 3 is a diagram illustrating an exemplary connection between a row driver and a pixel array of FIG. 2.

FIG. 3 is a diagram illustrating an exemplary connection between the row driver 140 and the pixel array 110 of FIG. 2, and illustrates a part of the pixel array 110 and transmission control signal lines. The pixel array 110 of FIG. 2 may include a first pixel array 110_1.

In FIG. 3 and the following drawings, a connection relationship between the pixels PX and each of transmission control signal lines TGL1, TGR1, TGL2, and TGR2 and mode control signal lines TGEL and TGER is illustrated through a connection CNT. Signals provided through the transmission control signal lines TGL1, TGR1, TGL2, and TGR2 and the mode control signal lines TGEL and TGER may be the transmission control signals TSs of FIG. 1. That is, the mode control signal lines TGEL and TGER may also be lines for transmitting signals provided to a gate of a transmission included in the pixel.

Although FIG. 3 and the following drawings illustrate that a first direction X is a row direction and a second direction Y is a column direction, it is understood that this is just one example. The second direction Y may be the row direction and the first direction X may be the column direction in another exemplary embodiment.

Referring to FIG. 3, the first pixel array 110_1 may include the plurality of pixel groups PG and the plurality of AF pixel groups PG_AF. Each of the plurality of pixel groups PG may include the plurality of pixels PX arranged in one row and two columns and one microlens ML disposed over the plurality of pixels PX. That is, each of the plurality of pixel groups PG may include a first pixel and a second pixel arranged side by side in the first direction X. The microlenses ML included in the first pixel array 110_1 may have the same shape and a constant size.

In the present exemplary embodiment, each of the plurality of pixel groups PG may include at least one of a green color filter G, a red color filter R, and a blue color filter B. For example, the first pixel group PG1 and the second pixel group PG2 may include the red color filters R, the third pixel group PG3 and the fourth pixel group PG4 may include the green color filters R, and the fifth pixel group PG5 and the sixth pixel group PG6 may include the blue color filters B. It is understood, however, that one or more exemplary embodiments are not limited thereto. For example, according to another exemplary embodiment, each of the plurality of pixel groups PG may include a white color filter or a yellow color filter.

Each of the plurality of AF pixel groups PG_AF may include the plurality of pixels PX arranged in one row and two columns and one microlens ML disposed over the plurality of pixels PX. In the present exemplary embodiment, each of the plurality of AF pixel groups PG_AF may include a green color filter G_AF.

Further, in the present exemplary embodiment, the plurality of pixel groups PG and the plurality of AF pixel groups PG_AF of the first pixel array 110_1 may include color filters to correspond to a Bayer pattern. The inventive concept(s) is not limited thereto, and according to another exemplary embodiment, each of the plurality of AF pixel groups PG_AF may include at least one of the red color filter, the blue color filter, the white color filter, and the yellow color filter.

The pixels PX included in the plurality of pixel groups PG may be connected to corresponding transmission control signal lines of the transmission control signal lines TGL1, TGR1, TGL2, and TGR2. For example, first pixels included in the first pixel group PG1 to the third pixel group PG3 may be connected to the first transmission control signal line TGL1, and second pixels included in the first pixel group PG1 to the third pixel group PG3 may be connected to the second transmission control signal line TGR1. In addition, for example, the first pixels included in the fourth pixel group PG4 to the sixth pixel group PG6 may be connected to the third transmission control signal line TGL2, and the second pixels included in the fourth pixel group PG4 to the sixth pixel group PG6 may be connected to the fourth transmission control signal line TGR2.

Some of the pixels PX included in the plurality of AF pixel groups PG_AF may be connected to a corresponding transmission control signal line among the transmission control signal lines TGL1, TGR1, TGL2, and TGR2, and the other of the pixels PX included in the plurality of AF pixel groups PG_AF may be connected to a corresponding mode control signal line of the mode control signal lines TGEL and TGER. For example, the first pixel disposed in a first column of the pixels PX included in the first AF pixel group PG_AF1 may be connected to the first mode control signal line TGEL and the second pixel disposed in a second column of the pixels PX included in the first AF pixel group PG_AF1 may be connected to the second transmission control signal line TGR1. Alternatively, for example, the first pixel disposed in the first column of the pixels PX included in the second AF pixel group PG_AF2 may be connected to the third transmission control signal line TGL2 and the second pixel disposed in the second column of the pixels PX included in the second AF pixel group PG_AF2 may be connected to the fourth mode control signal line TGER. Accordingly, the image sensor according to an exemplary embodiment may provide the AF function in the first direction X by using the pixel signal output from the first AF pixel group PG_AF1 and the pixel signal output from the second AF pixel group PG_AF2.

Although FIG. 3 illustrates that the first AF pixel group PG_AF1 and the second AF pixel group PG_AF2 are arranged in different rows and columns, it is understood that one or more other exemplary embodiments are not limited thereto. For example, according to another exemplary embodiment, the first AF pixel group PG_AF1 and the second AF pixel group PG_AF2 may be arranged in the same row or the same column.

In an exemplary embodiment, when the first transmission control line TGL1 connected to N numbers of pixels PX on a first row in the first direction X, the second transmission control line TGR1 connected to M numbers of pixels PX in the first row in the first direction X, and the first mode control signal line TGEL connected to K numbers of pixels PX in the first row in the first direction X, the K may be less than or equal to ⅓ of each of the N and the M. It is understood, however, that one or more other exemplary embodiments are not limited thereto, and the K may be less than or equal to ⅕, ⅛, or 1/15 of each of the N and the M, according to an arrangement structure of the pixels included in the pixel groups PG1, PG2, PG3, PG4, PG5, and PG6, and the AF pixel groups PG_AF1, and PG_AF2.

Figure 4:
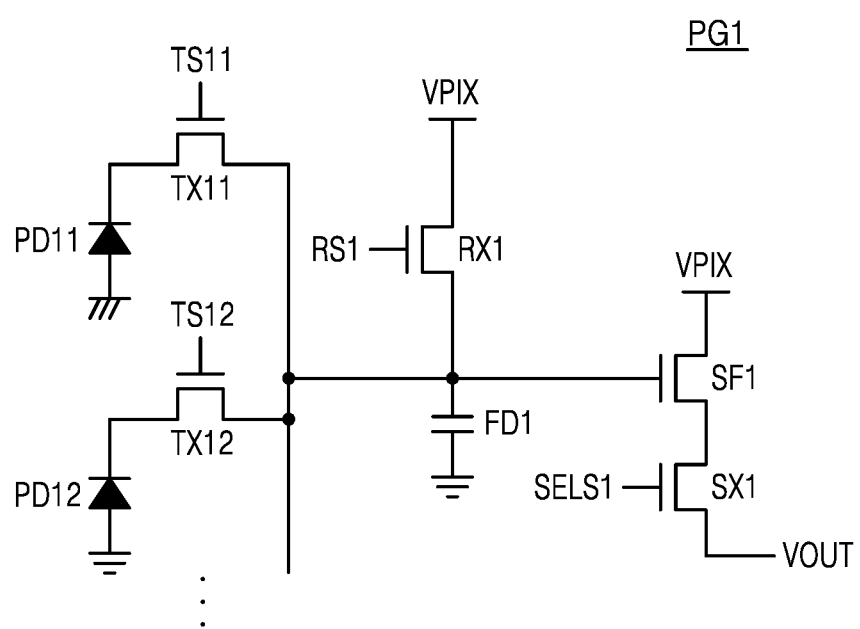
FIG. 4 is an example circuit diagram of a first pixel group of FIG. 3.

FIG. 4 is an exemplary circuit diagram of the first pixel group PG1 of FIG. 3. FIG. 4 illustrates an exemplary embodiment in which the pixels included in the first pixel group share a floating diffusion region, and, for the convenience of description, the same may be applied to the plurality of pixel groups PG and the plurality of AF pixel groups PG_AF. In the present exemplary embodiment, the plurality of pixels PX included in the same pixel group among the plurality of pixel groups PG may share the floating diffusion region, and the plurality of pixels PX included in the same AF pixel group among the plurality of AF pixel groups PG_AF may share the floating diffusion region. It is understood, however, that one or more other exemplary embodiments are not limited thereto, and three or more pixels may share the floating diffusion region.

Referring to FIG. 4, the first pixel disposed in the first column of the first pixel group PG1 may include a first photodiode PD11, a first transmission transistor TX11, a selection transistor SX1, a drive transistor SF1, and a reset transistor RX1. The second pixel disposed in the second column of the first pixel group PG1 may include a second photodiode PD12, a second transmission transistor TX12, the selection transistor SX1, the drive transistor SF1, and the reset transistor RX1. The first pixel and the second pixel may form a shared pixel structure in which a floating diffusion region FD1 is shared and the selection transistor SX1, the drive transistor SF1, and the reset transistor RX1 are shared with each other. In the present exemplary embodiment, at least one of the selection transistor SX1, the drive transistor SF1, and the reset transistor RX1 may be omitted.

Each of the first photodiode PD11 and the second photodiode PD12 may generate photo-charges that vary according to light intensity. For example, each of the first photodiode PD11 and the second photodiode PD12 is a PN junction diode, which generates charges, that is, electrons that are negative charges and holes that are positive charges, in proportion to the amount of incident light. Each of the first photodiode PD11 and the second photodiode PD12 is an example of a photoelectric conversion element, and may be at least one of a photo transistor, a photo gate, a pinned photo diode (PPD), and a combination thereof.

The floating diffusion region FD1 may operate as a capacitor. The first transmission transistor TX11 may transmit the photo-charges generated by the first photodiode PD11 to the floating diffusion region FD1 according to the first transmission control signal TS11. If (or based on) the first transmission transistor TX11 is turned on, the photo-charges generated by the first photodiode PD11 may be transmitted to the floating diffusion region FD1 to be accumulated and stored therein. The second transmission transistor TX12 may transmit the photo-charges generated by the first photodiode PD12 to the floating diffusion region FD1 according to the second transmission control signal TS12.

The reset transistor RX1 may periodically reset the charges accumulated in the floating diffusion region FD1. A source electrode of the reset transistor RX1 may be connected to the floating diffusion region FD1 and a drain electrode of the reset transistor RX1 may be connected to a power supply voltage VPIX. If (or based on) the reset transistor RX1 is turned on according to the reset control signal RS1, the power supply voltage VPIX connected to the drain electrode of the reset transistor RX1 is transmitted to the floating diffusion region FD1. When (or based on) the reset transistor RX1 is turned on, the charges accumulated in the floating diffusion region FD1 may be discharged to reset the floating diffusion region FD1.

The drive transistor SF may be controlled according to the amount of photo-charges accumulated in the floating diffusion region FD1. The drive transistor SF may buffer a signal according to the charges charged in the floating diffusion region FD1 as a buffer amplifier. The drive transistor SF may amplify a potential change in the floating diffusion region FD1 and output the amplified potential change to a column output line (for example, one column output line of a first column output line CLO_0 to an n-th column output line CLO_n−1 of FIG. 2) as a pixel signal VOUT.

The selection transistor SX1 having a drain terminal connected to a source terminal of the drive transistor SF may output the pixel signal VOUT to the CDS (for example, 151 of FIG. 2) through a column output line in response to a selection signal SELS1.

Figure 5:
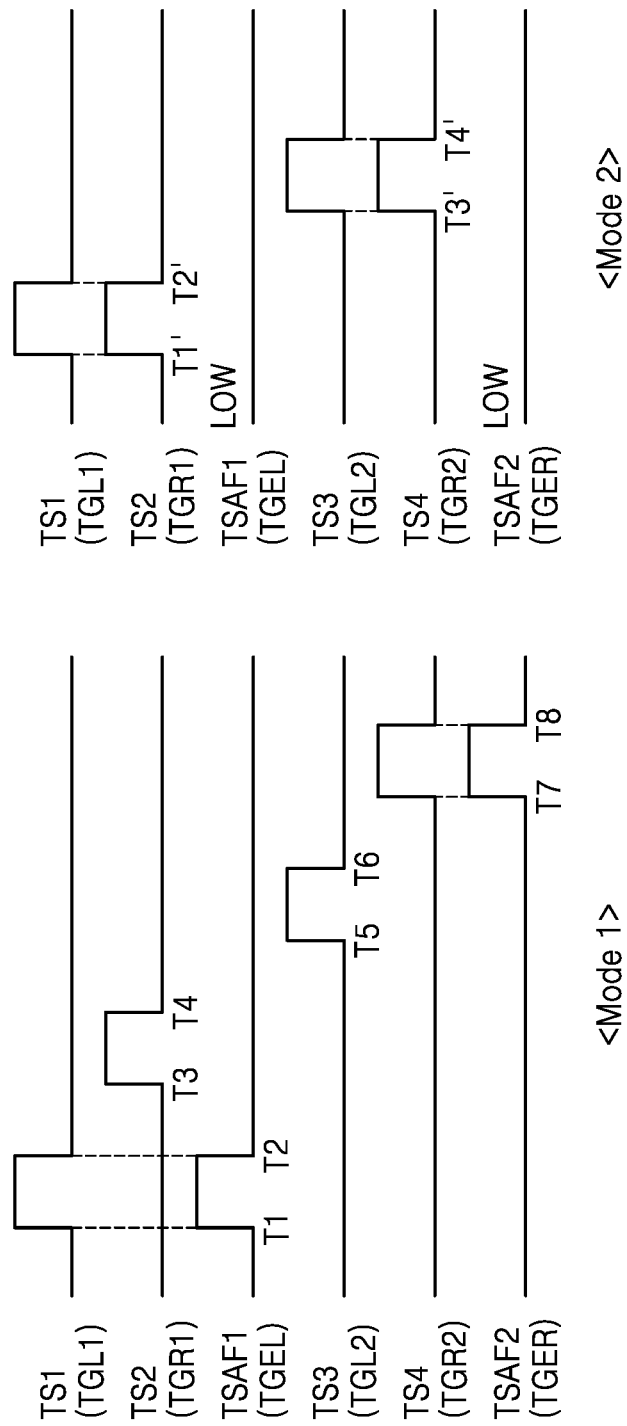
FIG. 5 is an exemplary timing diagram illustrating transmission control signals and mode control signals provided to each of a plurality of pixel groups and a plurality of AF pixel groups of FIG. 3.

FIG. 5 is an exemplary timing diagram illustrating the transmission control signal and the mode control signal provided to each of the plurality of pixel groups PX and the plurality of AF pixel groups PX_AF of FIG. 3.

Referring to FIGS. 3 and 5, the first to fourth transmission control signals TS1, TS2, TS3, and TS4 provided through the first to fourth transmission control signal lines TGL1, TGR1, TGL2, and TGR2 may be sequentially changed from a logic low to a logic high in the first mode. For example, the first transmission control signal TS1 may change from a logic low to a logic high at a first time T1 and may change from the logic high to the logic low at a second time T2. The second transmission control signal TS2 may change from the logic low to the logic high at a third time T3 and may change from the logic high to the logic low at a fourth time T4. The third transmission control signal TS3 may change from the logic low to the logic high at a fifth time T5 and may change from the logic high to the logic low at a sixth time T6. The fourth transmission control signal TS4 may change from the logic low to the logic high at a seventh time T7 and may change from the logic high to the logic low at an eighth time T8.

Further, a first mode control signal TSAF1 provided to the first mode control signal line TGEL may change from the logic low to the logic high at the first time T1 and may change from the logic high to the logic to low at the second time T2. That is, the first mode control signal TSAF1 may be activated at the same timing as the timing of the first transmission control signal TS1. A second mode control signal TSAF2 provided to the second mode control signal line TGER may change from the logic low to the logic high at the seventh time T7 and may change from the logic low to the logic low at the eighth time T8. That is, the fourth transmission control signal TS4 and the second mode control signal TSAF2 may be activated at the same timing.

In the first mode, the image sensor according to an exemplary embodiment may perform the AF function in the first direction X that is a row direction by using the first pixel signals corresponding to the photo-charges generated by the first pixels arranged in the first column of the plurality of pixel groups PG and the plurality of AF pixel groups PG_AF and the second pixel signals corresponding to the photo-charges generated by the second pixels arranged in the second column thereof. Accordingly, in the first mode, the image sensor generates AF information from the plurality of pixel groups PG and the plurality of AF pixel groups PG_AF, thereby providing a high resolution AF function.

In the second mode, the first transmission control signal TS1 and the second transmission control signal TS2, which are provided through the first transmission control signal line TGL1 and the second transmission control signal line TGR1, respectively, may change from the logic low to the logic high at a first time T1' and may change from the logic high to the logic low at a second time T2'. At this time, the first mode control signal TSAF1 provided to the first mode control signal line TGEL may maintain the logic low. That is, the first mode control signal TSAF1 may be deactivated. Accordingly, the first pixels and the second pixels included in each of the first pixel group PG1 to the third pixel group PG3 may simultaneously accumulate photo-charges in the shared floating diffusion region, and the pixel signals (for example, VOUT of FIG. 4) output from each of the first pixel group PG1 to the third pixel group PG3 may not include the AF information. In contrast to this, the first mode control signal TSAF1 provided to the first pixel of the first AF pixel group PG_AF1 maintains the logic low, and thus, the pixel signal output from the first AF pixel group PG_AF1 may be the second pixel signal corresponding to the photo-charges generated by the second pixel of the first AF pixel group PG_AF1.

In the second mode, the third transmission control signal TS3 and the fourth transmission control signal TS4, which are provided through the third transmission control signal line TGL2 and the fourth transmission control signal line TGR2, respectively, may change from the logic low to the logic high at a third time T3' and may change from the logic high to the logic low at a fourth time T4'. At this time, the second mode control signal TSAF2 provided to the second mode control signal line TGER may maintain the logic low. That is, the second mode control signal TSAF2 may be deactivated. Accordingly, the first pixels and the second pixels included in each of the fourth pixel group PG4 to the sixth pixel group PG6 may simultaneously accumulate photo-charges in the shared floating diffusion region, and the pixel signals output from each of the fourth pixel group PG4 to the sixth pixel group PG6 may not include the AF information. In contrast to this, the second mode control signal TSAF2 provided to the second pixel of the second AF pixel group PG_AF2 maintains the logic low, and thus, the pixel signals output from the second AF pixel group PG_AF2 may be the first pixel signal corresponding to the photo-charges generated by the first pixel of the second AF pixel group PG_AF2.

In the second mode, the image sensor according to an exemplary embodiment may perform the AF function in the direction X by using the second pixel signal output from the first AF pixel group PG_AF1 and the first pixel signal output from the second AF pixel group PG_AF2. Accordingly, in the second mode, the image sensor may provide a relatively high speed AF function.

Figure 6A:
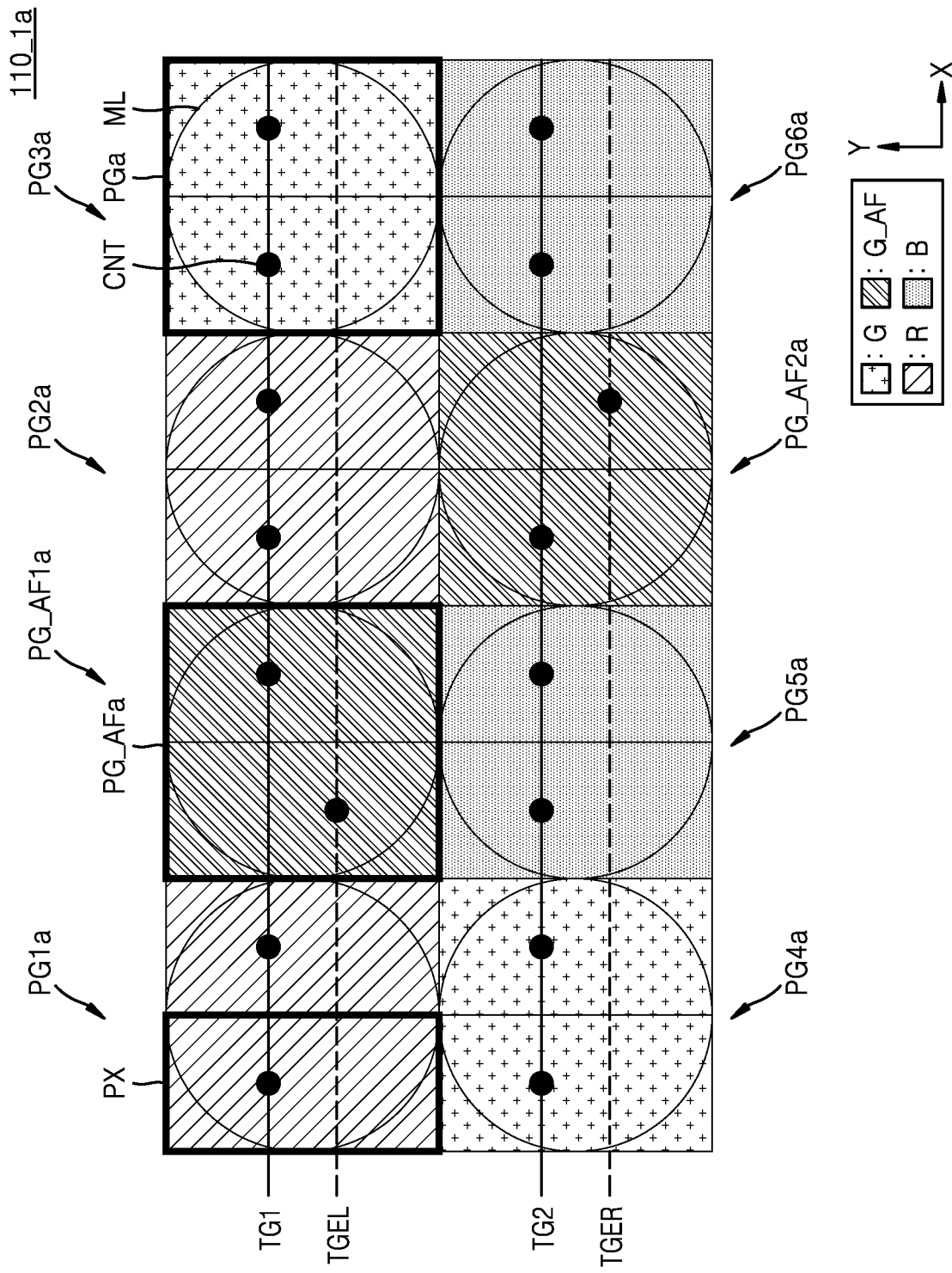
FIGS. 6A, 6B, and 7 are diagrams illustrating another exemplary connection between the row driver and the pixel array of FIG. 2.
Figure 6B:
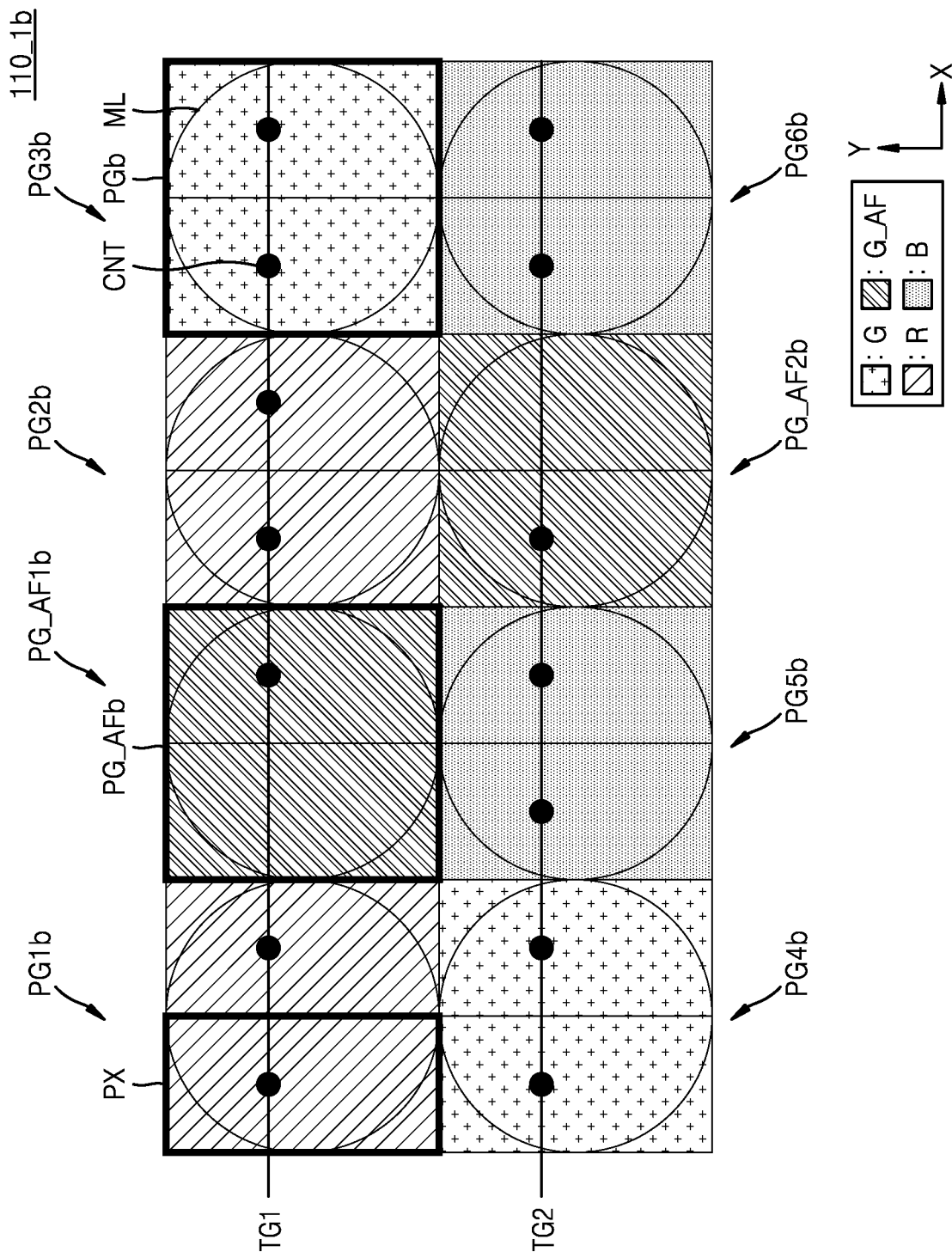

FIGS. 6A and 6B are diagrams illustrating an exemplary connection between the row driver 140 and the pixel array 110 of FIG. 2 and illustrate a part of the pixel array 110 and transmission control signal lines connected to a part of the pixel array 110. In describing FIGS. 6A and 6B, redundant descriptions of the same symbols or components as in FIG. 3 may be omitted. The pixel array 110 of FIG. 2 may include at least one of a second pixel array 110_1a and a third pixel array 110_1b.

Referring to FIG. 6A, the second pixel array 110_1a may include a plurality of pixel groups PGa and a plurality of AF pixel groups PG_AFa. The plurality of pixels PX included in first pixel group PG1a to third pixel group PG3a may be connected to the transmission control signal line TG1 and the plurality of pixels PX included in fourth pixel group PG4a to sixth pixel group PG6a may be connected to the transmission control signal line TG2.

Among the pixels PX included in first AF pixel group PG_AF1a, the first pixel disposed in the first column may be connected to the first mode control signal line TGEL, and the second pixel disposed in the second column may be connected to the transmission control signal line TG1. Among the pixels PX included in the second AF pixel group PG_AF2a, the first pixel disposed in the first column may be connected to the transmission control signal line TG2, and the second pixel disposed in the second column may be connected to the second mode control signal line TGER. When (or based on) the AF operation is performed, the first mode control signal provided to the first mode control signal line TGEL may maintain a logic low and the second mode control signal provided to the second mode control signal line TGER may maintain a logic low.

In an exemplary embodiment, when the transmission control line TG1 connected to N numbers of pixels PX on a first row in the first direction X, and the first mode control signal line TGEL connected to K numbers of pixels PX in the first row in the first direction X, the K may be less than or equal to ½ of the N. It is understood, however, that one or more other exemplary embodiments are not limited thereto.

Referring to FIG. 6B, the third pixel array 110_1b may include a plurality of pixel groups PGb and a plurality of AF pixel groups PG_AFb. The plurality of pixels PX included in first pixel group PG1b to third pixel group PG3b may be connected to the transmission control signal line TG1 and the plurality of pixels PX included in fourth pixel group PG4b to sixth pixel group PG6b may be connected to the transmission control signal line TG2.

Some of the pixels PX included in the plurality of AF pixel groups PG_AFb may be connected to one corresponding line among the transmission control signal lines TG1 and TG2, and other of the pixels PX included in the plurality of AF pixel groups PG_AFb may not be connected to the transmission control signal lines TG1 and TG2.

Referring to FIGS. 6A and 6B, the image sensor according to an exemplary embodiment may perform the AF operation of the second mode. The image sensor may perform the AF function in the first direction X by using the second pixel signal output from the first AF pixel group PG_AF1a or PG_AF1b and the first pixel signal output from the second AF pixel group PG_AF2a or PG_AF2b, thereby providing a relatively high speed AF function.

Figure 7:
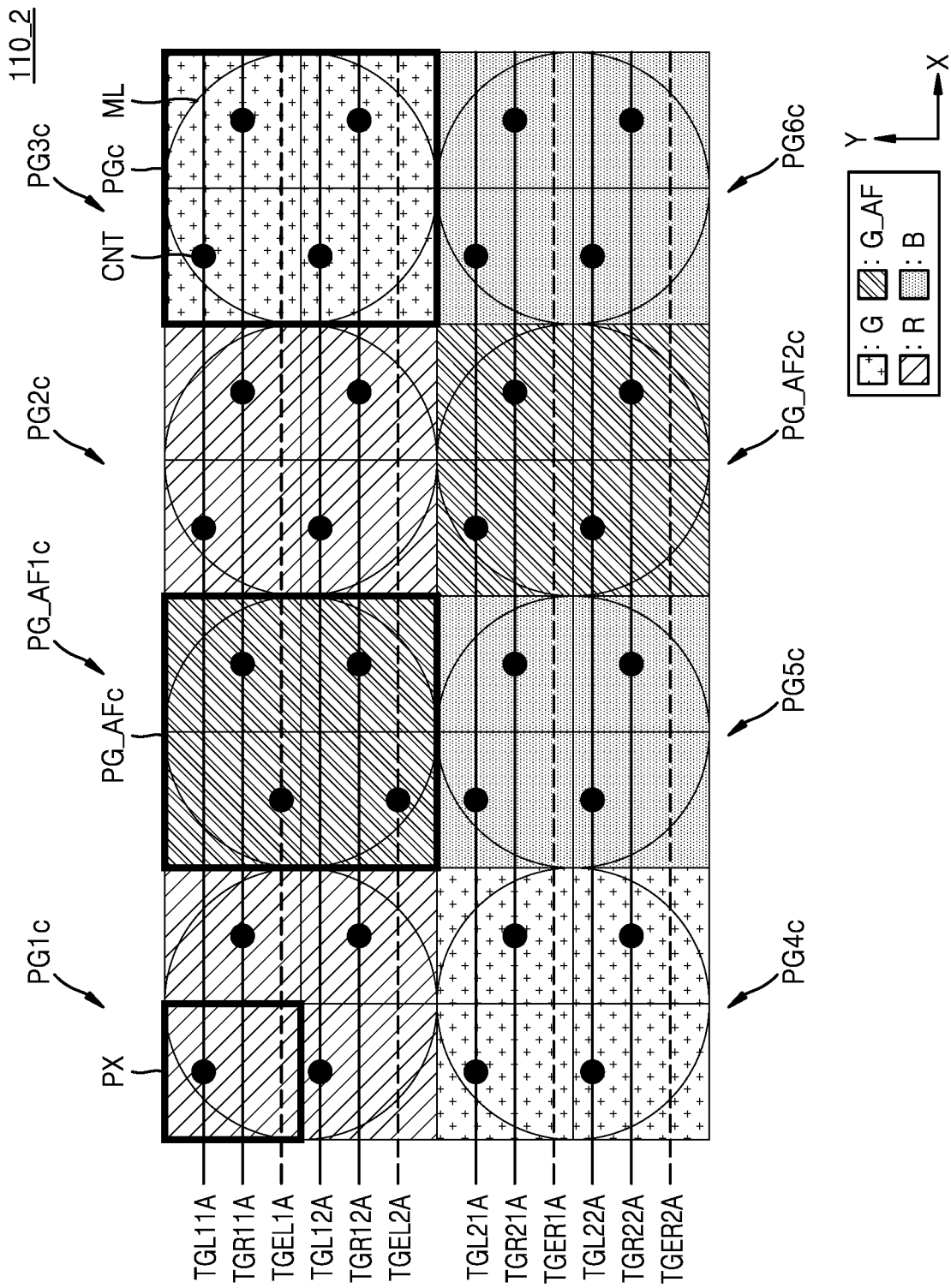
Figure 8:
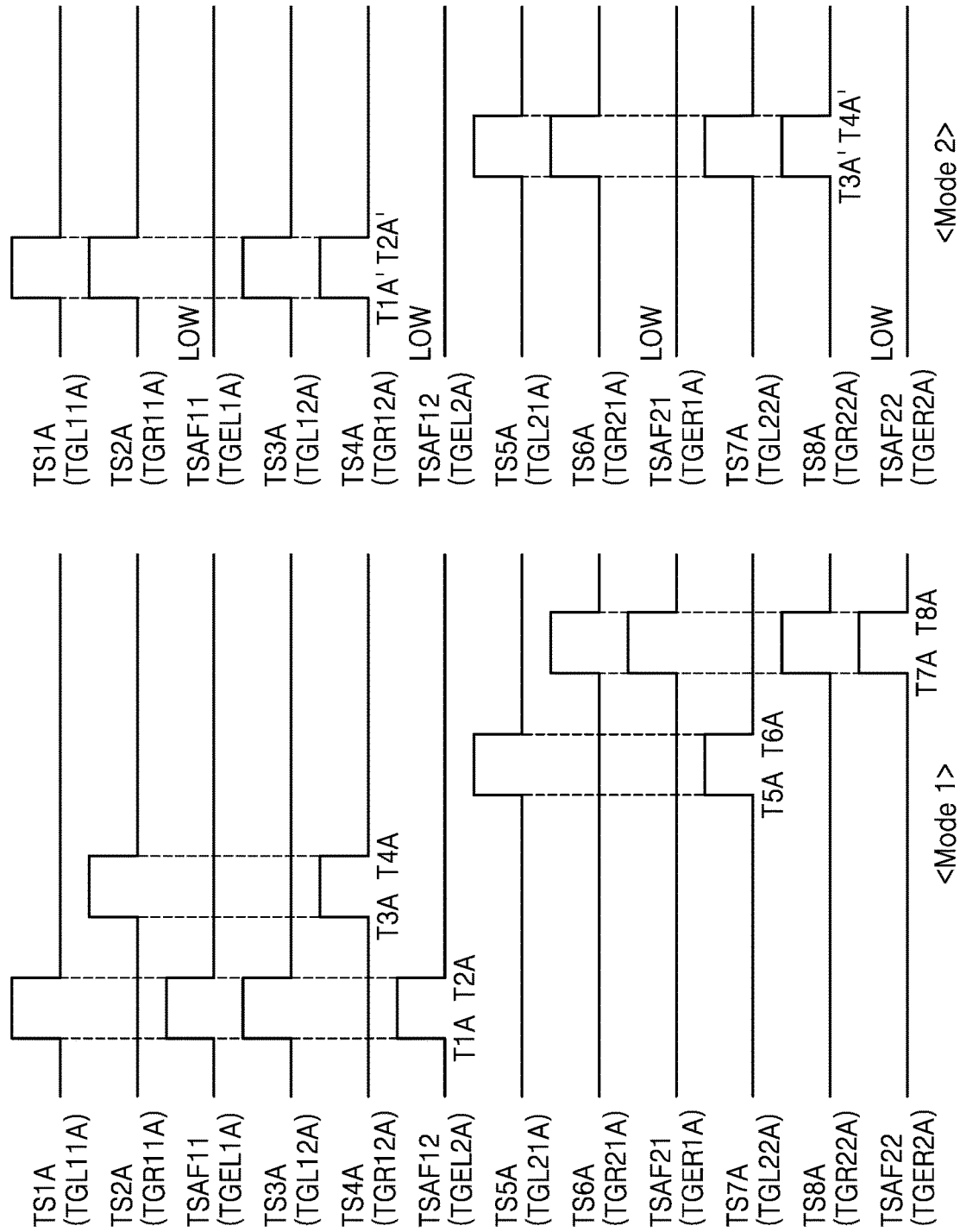
FIG. 8 is an exemplary timing diagram illustrating the transmission control signals provided to each of the plurality of pixel groups and the plurality of AF pixel groups of FIG. 7.

FIG. 7 is a diagram illustrating another exemplary connection between the row driver 140 and the pixel array 110 of FIG. 2 and illustrates a part of the pixel array 110 and the transmission control signal lines connected to a part of the pixel array 110. FIG. 8 is an exemplary timing diagram illustrating the transmission control signals provided to each of the plurality of pixel groups PX and the plurality of AF pixel groups PX_AF of FIG. 7. In FIG. 7, redundant descriptions of the same symbols or components as in FIG. 3 may be omitted. The pixel array 110 of FIG. 2 may include a fourth pixel array 110_2.

Referring to FIG. 7, the fourth pixel array 110_2 may include a plurality of pixel groups PGc and a plurality of AF pixel groups PG_AFc. Each of the plurality of pixel groups PGc may include the plurality of pixels PX arranged in two rows and two columns and one microlens ML disposed over the plurality of pixels PX. That is, each of the plurality of pixel groups PG may include the first pixel disposed in the first row and the first column, the second pixel disposed in the first row and the second column, a third pixel disposed in the second row and the first column, and a fourth pixel disposed in the second row and the second column. In the present exemplary embodiment, the first pixel to the fourth pixel included in the same pixel group among the plurality of pixel groups PG may share the floating diffusion region.

The first pixels included in first pixel group PG1c to third pixel group PG3c may be connected to a first transmission control signal line TGL11A, the second pixels may be connected to a second transmission control signal line TGR11A, the third pixels may be connected to a third transmission control signal line TGL12A, and the fourth pixels may be connected to a fourth transmission control signal line TGR12A. The first pixels included in the fourth pixel group PG4c to the sixth pixel group PG6c may be connected to a fifth transmission control signal line TGL21A, the second pixels may be connected to a sixth transmission control signal line TGR21A, the third pixels may be connected to a seventh transmission control signal line TGL22A, and the fourth pixels may be connected to an eighth transmission control signal line TGR22A.

Some of the pixels PX included in the plurality of AF pixel groups PG_AFc may be connected to a corresponding line among the transmission control signal lines TGL11A to TGR22A, and other of the pixels PX included in the plurality of AF pixel groups PG_AFc may be connected to a corresponding line of the mode control signal lines TGEL1A, TGEL2A, TGER1A, and TGER2A. For example, among the pixels PX included in the first AF pixel group PG_AF1c, the first pixel and the third pixel disposed in the first column may be respectively connected to the first mode control signal line TGEL1A and the third mode control signal line TGEL2A, and the second pixel and the fourth pixel disposed in the second column may be respectively connected to the second transmission control signal line TGR11A and the fourth transmission control signal line TGR12A. In addition, for example, among the pixels PX included in the second AF pixel group PG_AF2c, the second pixel and the fourth pixel disposed in the second column may be respectively connected to the second mode control signal line TGER1A and the fourth mode control signal line TGER2A, and the first pixel and the third pixel disposed in the first column may be respectively connected to the fifth transmission control signal line TGL21A and the seventh transmission control signal TGL22A.

In an exemplary embodiment, when the first transmission control line TGL11A connected to N numbers of pixels PX on a first row in the first direction X, the second transmission control line TGR11A connected to M numbers of pixels PX in the first row in the first direction X, and the first mode control signal line TGEL1A connected to K numbers of pixels PX in the first row in the first direction X, the K may be less than or equal to ⅓ of each of the N and the M. It is understood, however, that one or more other exemplary embodiments are not limited thereto. Referring to FIGS. 7 and 8, in the first mode, the first and third transmission control signals TS1A and TS3A provided through the first and third transmission control signal lines TGL11A and TGL12A, respectively, may change from a logic low to a logic high at a first time T1A and may change from the logic high to the logic low at a second time T2A. In addition, the first and third mode control signals TSAF11 and TSAF12 provided through the first and third mode control signal lines TGEL1A and TGEL2A, respectively, may change from the logic low to the logic high at the first time T1A and may change from the logic high to the logic low at the second time T2A.

The second and fourth transmission control signals TS2A and TS4A provided through the second and fourth transmission control signal lines TGR11A and TGR12A, respectively, may change from the logic low to the logic high at a third time T3A and may change from the logic high to the logic low at a fourth time T4A. The fifth and seventh transmission control signals TS5A and TS7A provided through the fifth and seventh transmission control signal lines TGL21A and TGL22A, respectively, may change from the logic low to the logic high at a fifth time T5A and may change from the logic high to the logic low at a sixth time T6A.

The sixth and eighth transmission control signals TS6A and TS8A provided through the sixth and eighth transmission control signal lines TGR21A and TGR22A, respectively, may change from the logic low to the logic high at a seventh time T7A and may change from the logic high to the logic low at an eighth time T8A. In addition, the second and fourth mode control signals TSAF21 and TSAF22 provided through the second and fourth mode control signal lines TGER1A and TGER2A, respectively, may change from the logic low to the logic high at the seventh time T7A and may change from the logic high to the logic low at the eighth time T8A.

In the first mode, the image sensor according to an exemplary embodiment may perform the AF function in the first direction X, which is a row direction, by using the first pixel signals corresponding to the photo-charges generated by the first pixels and the third pixels disposed in the first column of the plurality of pixel groups PGc and the plurality of AF pixel groups PG_AFc and the second pixel signals corresponding to the photo-charges generated by the second pixels and the fourth pixels disposed in the second column thereof. Accordingly, in the first mode, the image sensor may generate AF information from the plurality of pixel groups PGc and the plurality of AF pixel groups PG_AFc and may provide a high resolution AF function.

Conversely, in the second mode, the first to fourth transmission control signals TS1A to TS4A provided through the first to fourth transmission control signal lines TGL11A, TGR11A, TGL12A, and TGR12A, respectively, may change from a logic low to a logic high at a first time T1A' and may change from the logic high to the logic low at a second time T2A'. At this time, the first and third mode control signals TSAF11 and TSAF12 may maintain the logic low. In the second mode, the pixel signal output from the first AF pixel group PG_AF1c may be the second pixel signal that is a phase signal corresponding to the photo-charges generated by the second pixel and the fourth pixel of the first AF pixel group PG_AF1c.

The fifth to eighth transmission control signals TS5A to TS8A provided through the fifth to eighth transmission control signal lines TGL21A, TGR21A, TGL22A, and TGR22A, respectively, may change from a logic low to a logic high at a third time T3A' and may change from the logic high to the logic low at a fourth time T4A'. At this time, the second mode control signal TSAF21 and the fourth mode control signal TSAF22 may maintain the logic low. In the second mode, the pixel signal output from the second AF pixel group PG_AF2c may be the first pixel signal that is a phase signal corresponding to the photo-charges generated by the first pixel and the third pixel of the second AF pixel group PG_AF2c.

In the second mode, the image sensor according to an exemplary embodiment may perform the AF function in the direction X by using the first pixel signal output from the first AF pixel group PG_AF1c and the second pixel signal output from the second AF pixel group PG_AF2c. Accordingly, in the second mode, the image sensor may provide a relatively high speed AF function.

Figure 9B:
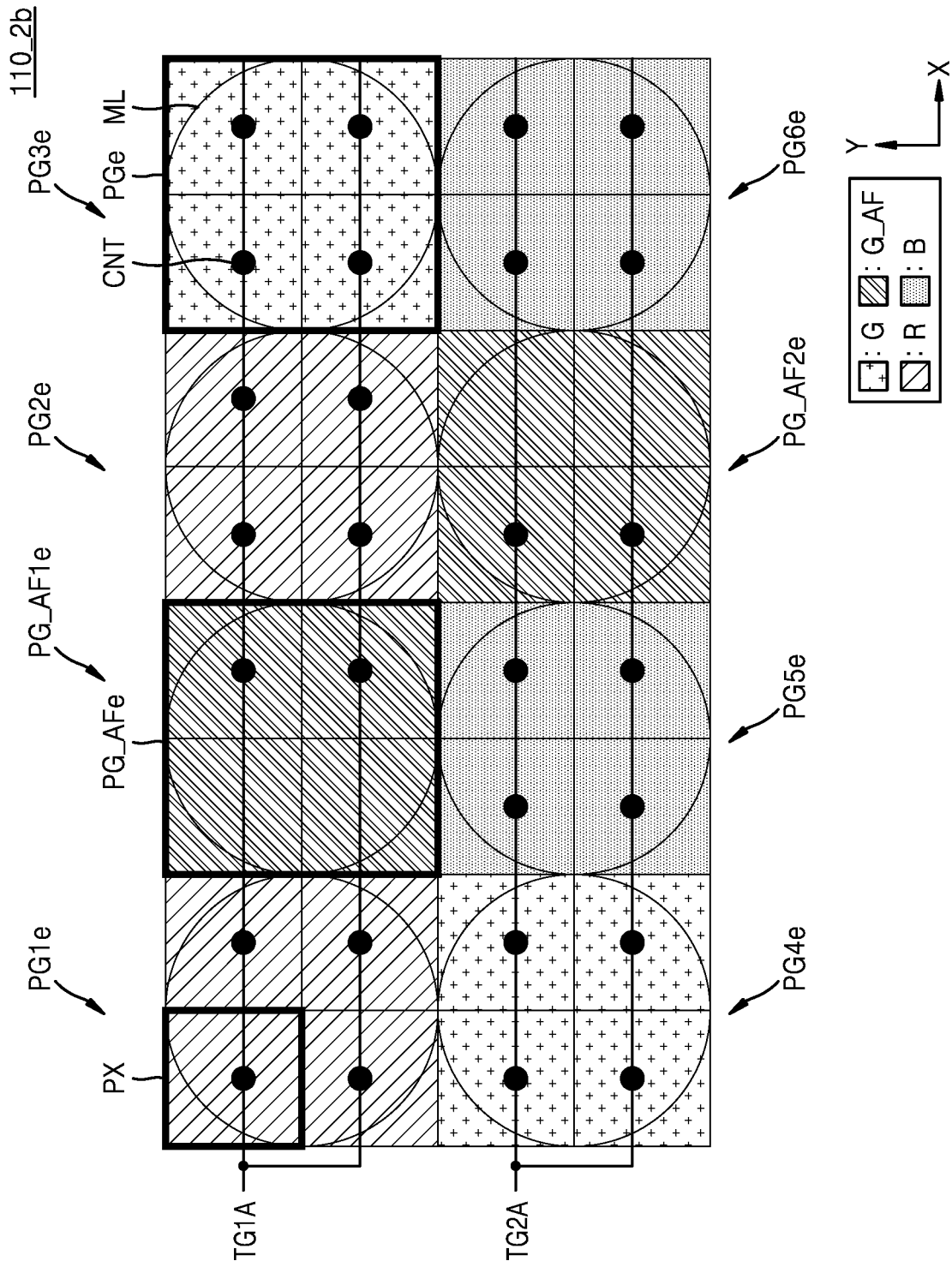

FIGS. 9A and 9B are diagrams illustrating another exemplary connection between the row driver 140 and the pixel array 110 of FIG. 2 and illustrate a part of the pixel array 110 and the transmission control signal lines connected to a part of the pixel array 110. In describing FIGS. 9A and 9B, redundant descriptions of the same symbols or components as in FIGS. 3 and 7 may be omitted. The pixel array 110 of FIG. 2 may include at least one of a fifth pixel array 110_2a and a sixth pixel array 110_2b.

Referring to FIG. 9A, the fifth pixel array 110_2a may include a plurality of pixel groups PGd and a plurality of AF pixel groups PG_AFd. The plurality of pixels PX included in first to third pixel groups PG1d to PG3d may be connected to the transmission control signal line TG1A. The plurality of pixels PX included in fourth to sixth pixel groups PG4d to PG6d may be connected to the transmission control signal line TG2A.

Some of the pixels PX included in the plurality of AF pixel groups PG_AFd may be connected to one corresponding line among the transmission control signal lines TG1A and TG2A and the other of the pixels included in the plurality of AF pixel groups PG_AFd may be connected to one corresponding line of the mode control signal lines TGELA and TGERA. For example, among the pixels PX included in the first AF pixel group PG_AF1d, the first pixel and the third pixel disposed in the first column may be connected to the first mode control signal line TGELA, and the second pixel and the fourth pixel disposed in the second column may be connected to the transmission control signal line TG1A. Alternatively, for example, among the pixels PX included in the second AF pixel group PG_AF2d, the first pixel and the third pixel disposed in the first column may be connected to the transmission control signal line TG2A, and the second pixel and the fourth pixel disposed in the second column. may be connected to the second mode control signal line TGERA.

In the AF operation of the second mode, the first mode control signal provided to the first mode control signal line TGELA may maintain the logic low. In addition, the first mode control signal provided to the second mode control signal line TGERA may maintain the logic low.

In an exemplary embodiment, when the transmission control line TG1A connected to N numbers of pixels PX on a first row in the first direction X, and the first mode control signal line TGELA connected to K numbers of pixels PX in the first row in the first direction X, the K may be less than or equal to ⅐ of the N. It is understood, however, that one or more other exemplary embodiments are not limited thereto.

Referring to FIG. 9B, the sixth pixel array 110_1b may include a plurality of pixel groups PGe and a plurality of AF pixel groups PG_AFe. The plurality of pixels PX included in the plurality of pixel groups PGe may be connected to one corresponding line of the transmission control signal lines TG1A and TG2A. Some of the pixels PX included in the plurality of AF pixel groups PG_AFe may be connected to one corresponding line among the transmission control signal lines TG1A and TG2A, and the other of the pixels PX included in the plurality of AF pixel groups PG_AFe may not be connected to the transmission control signal lines TG1A and TG2A.

Referring to FIGS. 9A and 9B, the image sensor according to an exemplary embodiment may perform the AF operation of the second mode. The image sensor may perform the AF function in the first direction X by using the second pixel signal output from the first AF pixel group PG_AF1d or PG_AF1e and the first pixel signal output from the second AF pixel group PG_AF2d or PG_AF2e, thereby providing a relatively high speed AF function.

Figure 10A:
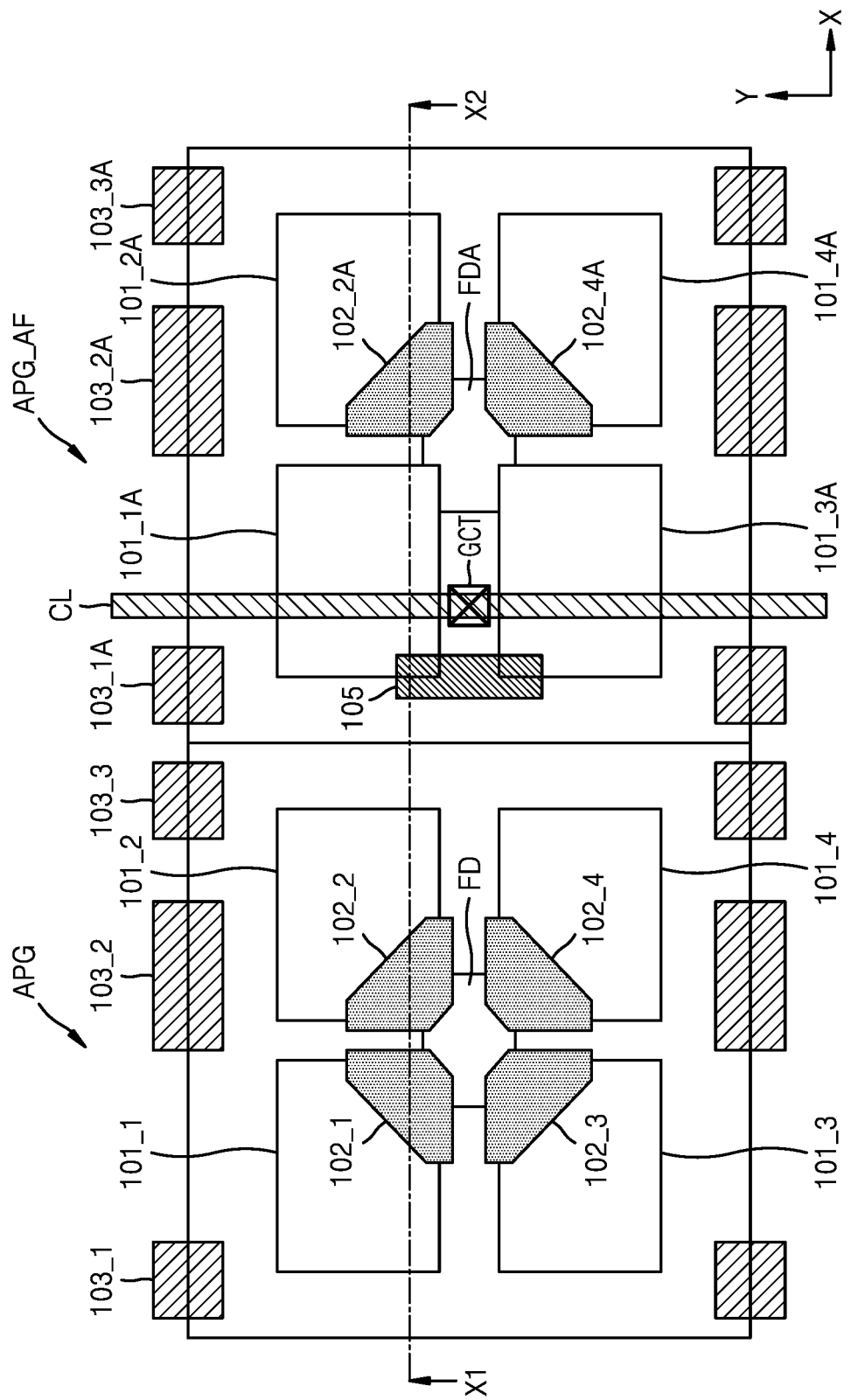
FIG. 10A is an exemplary layout of a first pixel group and a first AF pixel group included in a sixth pixel array of FIG. 9B.
Figure 10B:
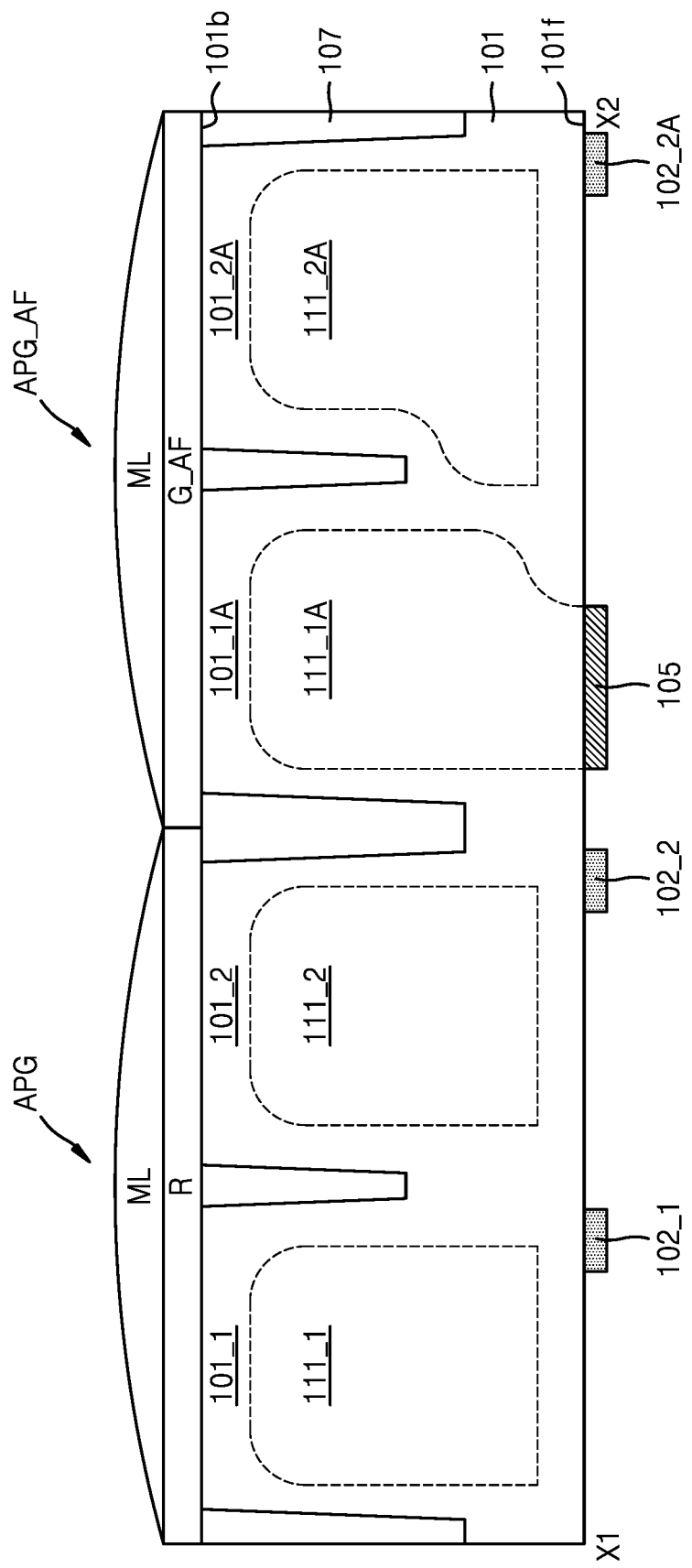
FIG. 10B is a cross-sectional view taken along line X1-X2 of FIG. 10A.
Figure 10C:
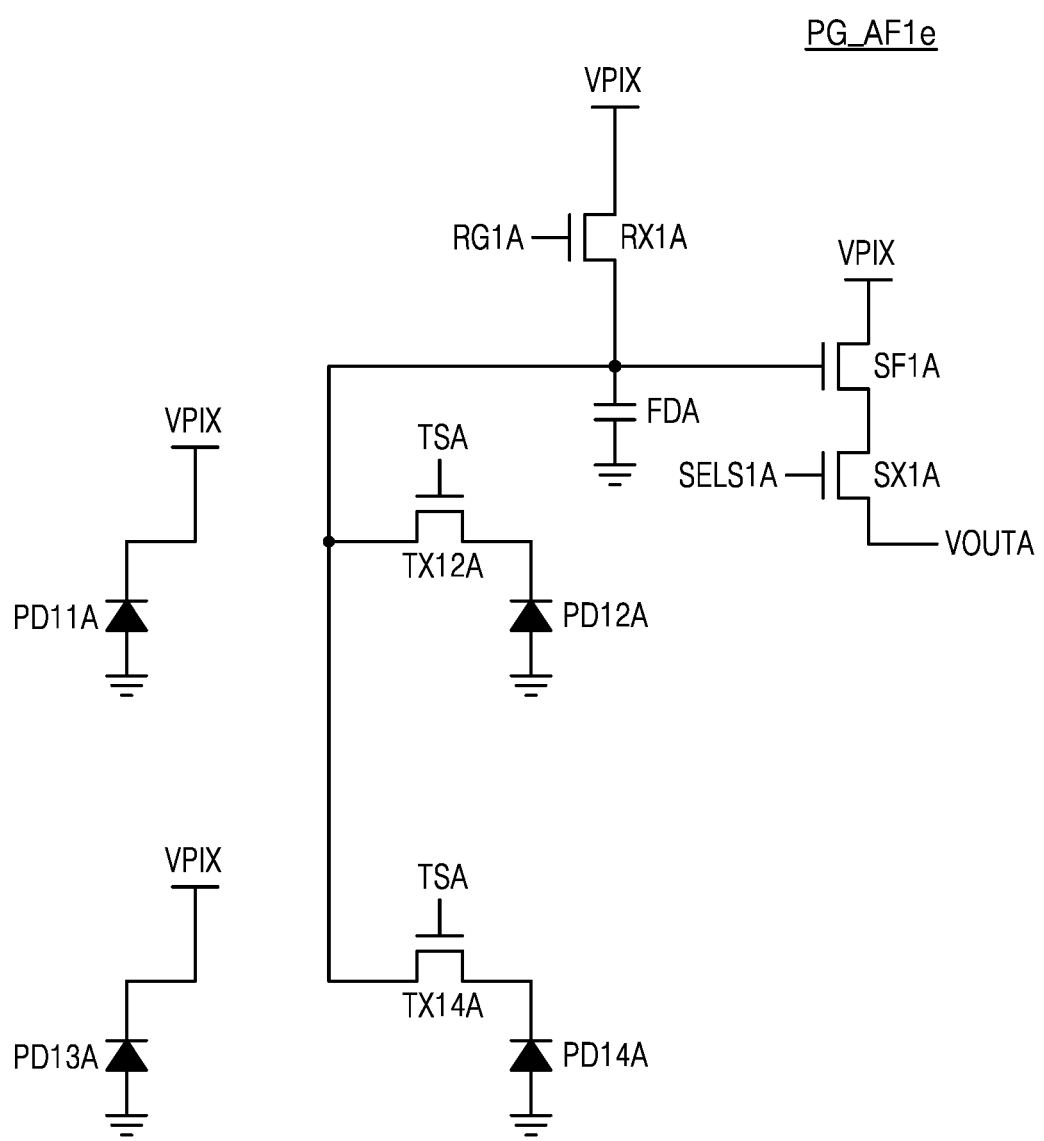
FIG. 10C is an exemplary circuit diagram of the first AF pixel group of FIG. 10A.

FIG. 10A is an exemplary layout of a first pixel group PG1e and a first AF pixel group PG_AF1e included in the sixth pixel array 110_2b of FIG. 9B. FIG. 10B is a cross-sectional view taken along line X1-X2 of FIG. 10A. FIG. 10C is an exemplary circuit diagram of the first AF pixel group PG_AF1e of FIG. 10A.

Referring to FIGS. 10A and 10B, a substrate 101 may include a first pixel group region APG in which a first pixel group (for example, PG1e of FIG. 9B) is formed and a first AF pixel group region APG in which a first AF pixel group (for example, PG_AF1e of FIG. 1B) is formed. The substrate 101 may be a silicon wafer, a silicon on insulator (SOI) substrate, or a semiconductor epitaxial layer. The substrate 101 may include a first surface 101f and a second surface 101b facing or opposing each other. For example, the first surface 101f may be a front surface of the substrate 101, and the second surface 101b may be a rear surface of the substrate 101. Light may be incident on the second surface 101b.

A pixel isolation layer 107 having a planar mesh structure may be disposed on the substrate 101. The substrate 101 may include semiconductor layers 101_1 to 101_4 and 101_1A to 101_4A separated by the pixel isolation layer 107. In the present exemplary embodiment, each of the semiconductor layers 101_1 to 101_4 and 101_1A to 101_4A may be doped with impurities of a first conductivity type (for example, P-type).

Well regions 111_1, 111_2, 111_1A, and 111_2A doped with impurities of a second conductivity type (for example, N-type) may be respectively disposed in the semiconductor layers 101_1 to 101_4 and 101_1A to 101_4A. The well regions 111_1, 111_2, 111_1A, and 111_2A may be arranged in a matrix in the first and second directions X and Y in a plan view of the first and second directions X and Y.

Each of the well regions 111_1, 111_2, 111_1A, and 111_2A formed in the semiconductor layers 101_1 to 101_4 and 101_1A to 101_4A may form a photosensitive element, for example, a photodiode. Thus, the first to fourth pixels of the first pixel group PG1e may be respectively formed in the first to fourth semiconductor layers 101_1 to 101_4 of the first pixel group region AGP. In addition, the first to fourth pixels of the first AF pixel group PG_AF1e may be respectively formed in the first to fourth semiconductor layers 101_1A to 101_4A of the first AF pixel group region APG_AF.

In the present exemplary embodiment, the second well region 111_2A formed in the second semiconductor layer 101_2A of the first AF pixel group region APG_AF may be larger than the first well region 111_1A formed in the first semiconductor layer 101_1A of the first AF pixel group region APG_AF. Further, in the present exemplary embodiment, the second well region 111_2A formed in the second semiconductor layer 101_2A of the first AF pixel group region APG_AF may be larger than the first well region 111_1 and the second well region 111_2 respectively formed in the first semiconductor layer 101_1 and the second semiconductor layer 101_2 of the first pixel group region AGP. Since a transmission gate electrode is not formed in the first semiconductor layer 101_1A of the first AF pixel group region APG_AF, the second well region 111_2A may be formed relatively large and a full well capacity (FWC) of the second well region 111_2A may increase.

Transmission gate electrodes 102_1 to 102_4, 102_2A, and 204_4A, which are gate electrodes of the transmission transistor, may be formed on the first surface 101f of the semiconductor layers 101_1 to 101_4 and 101_1A to 101_4A. For example, the first to fourth transmission gate electrodes 102_1 to 102_4 may be respectively formed on the first to fourth semiconductor layers 101_1 to 101_4 of the first pixel group region AGP. A second transmission gate electrode 102_2A and a fourth transmission gate electrode 102_4A may be respectively formed on the second semiconductor layer 101_2A and the fourth semiconductor layer 101_4A of the first AF pixel group region APG_AF. However, the transmission gate electrode may not be formed on the first semiconductor layer 101_1A and the third semiconductor layer 101_3A of the first AF pixel group region APG_AF.

A first contact GCT to which a ground voltage is applied may be formed in the first AF pixel group region AGP_AF. The first contact GCT may provide the ground voltage provided from a metal line CL to the first to fourth semiconductor layers 101_1A to 101_4A of the first AF pixel group region APG_AF. In the present exemplary embodiment, the first contact GCT may be in contact with a P-type doped region of the substrate 101, and the ground voltage may also be applied to the first to fourth semiconductor layers 101_1 to 101_4 through the P-type doped region. Accordingly, since the first contact GCT and the P-type doped region are formed, a dark current may be prevented from occurring in the first AF pixel group region APG_AF.

In contrast to this, the first contact GCT to which the ground voltage is applied and the P-type doped region in contact with the first contact GCT may not be formed in the first pixel group region AGP. Since the first contact GCT is not formed in the first pixel group region AGP, the first to fourth semiconductor layers 101_1 to 101_4 of the first pixel group region AGP may be formed to be large (or relatively large), and spaces in which the well regions (for example, 111_1 and 111_2) are formed may be secured in the first to fourth semiconductor layers 101_1 to 101_4 of the one pixel group PG1e.

A second contact 105 to which a predetermined voltage (for example, a power supply voltage VPIX of FIG. 10C) is applied may be formed in the first AF pixel group region AGP_AF. The second contact 105 may be formed under the first well region 111_1A and may be in contact with the first well region 111_1A. As the power supply voltage is applied to the second contact 105, electrons of the first well region 111_1A may be prevented from diffusing to the outside of the first well region 111_1A. Although FIG. 10B illustrates that the second contact 105 is formed under the first surface 101f, the inventive concept(s) is not limited thereto. When the transmission transistor is formed in the first semiconductor layer 101_1 and the third semiconductor layer 101_3, a doped region may be formed in contact with an N-type doped region of the transmission transistor, and the power supply voltage may be applied to the doped region. Although FIG. 10A illustrates that the second contact 105 is formed over the first semiconductor layer 101_1A and the third semiconductor layer 101_3A, the inventive concept(s) is not limited thereto. In an exemplary embodiment, the second contact 105 may be formed in each of the first semiconductor layer 101_1A and the third semiconductor layer 101_3A.

One floating diffusion region FD may be formed between the first to fourth semiconductor layers 101_1 to 101_4 of the first pixel group region APG, and a floating diffusion region FDA may be formed between the first to fourth semiconductor layers 101_1A and 101_4A of the first AF pixel group region APG_AF. In the present exemplary embodiment, the floating diffusion regions FD and FDA may be doped with N-type impurities.

A reset gate electrode 103_1, a drive gate electrode 103_2, and a selection gate electrode 103_3, which are gate electrodes of the reset transistor, the drive transistor, and the selection transistor, respectively, may be formed in the first pixel group region AGP. A reset gate electrode 103_1A, a drive gate electrode 103_2A, and a selection gate electrode 103_3A, which are gate electrodes of the reset transistor, the drive transistor, and the selection transistor, respectively, may be formed in the first AF pixel group region AGP_AF.

Referring to FIG. 10C, a first pixel of the first AF pixel group PG_AF1e may include a first photodiode PD11A, and a third pixel of the first AF pixel group PG_AF1e may include a third photodiode PD13A. The ground voltage may be applied to anode terminals of the first photodiode PD11A and the third photodiode PD13A, and the power supply voltage VPIX may be applied to cathode terminal thereof. That is, each of the first pixel and the third pixel of the first AF pixel group PG_AF1e may not include a transmission transistor. Each of the first pixel and the third pixel of the first AF pixel group PG_AF1e may be electrically separated from the floating diffusion region FDA.

A second pixel of the first AF pixel group PG_AF1e may include a second photodiode PD12A, a second transmission transistor TX12A, a selection transistor SX1A, a drive transistor SF1A, and a reset transistor RX1A. A fourth pixel of the first AF pixel group PG_AF1e may include a fourth photodiode PD14A, a fourth transmission transistor TX14A, a selection transistor SX1A, a drive transistor SF1A, and a reset transistor RX1A. The second pixel and the fourth pixel may form a shared pixel structure in which the floating diffusion region FDA is shared and the selection transistor SX1A, the drive transistor SF1A, and the reset transistor RX1A are shared with each other.

The second transmission transistor TX12A and the fourth transmission transistor TX14A may transmit photo-charges generated by the second photodiode PD2A and the fourth photodiode PD4A according to (or based on) the transmission control signal TSA to the floating diffusion region FDA. The transmission control signal TSA may be transmitted to the second transmission transistor TX12A and the fourth transmission transistor TX14A through the transmission control signal line TG1A of FIG. 7C.

The reset transistor RX1A may transmit the power supply voltage VPIX connected to a drain electrode of the reset transistor RX1A to the floating diffusion region FDA in response to (or based on) a reset control signal RS1A. The drive transistor SF1A may be controlled according to (or based on) the amount of photo-charges accumulated in the floating diffusion region FDA. The selection transistor SX1A may output a pixel signal VOUTA to the CDS (for example, 151 of FIG. 2) through the column output line in response to the selection signal SELS1.

Figure 11A:
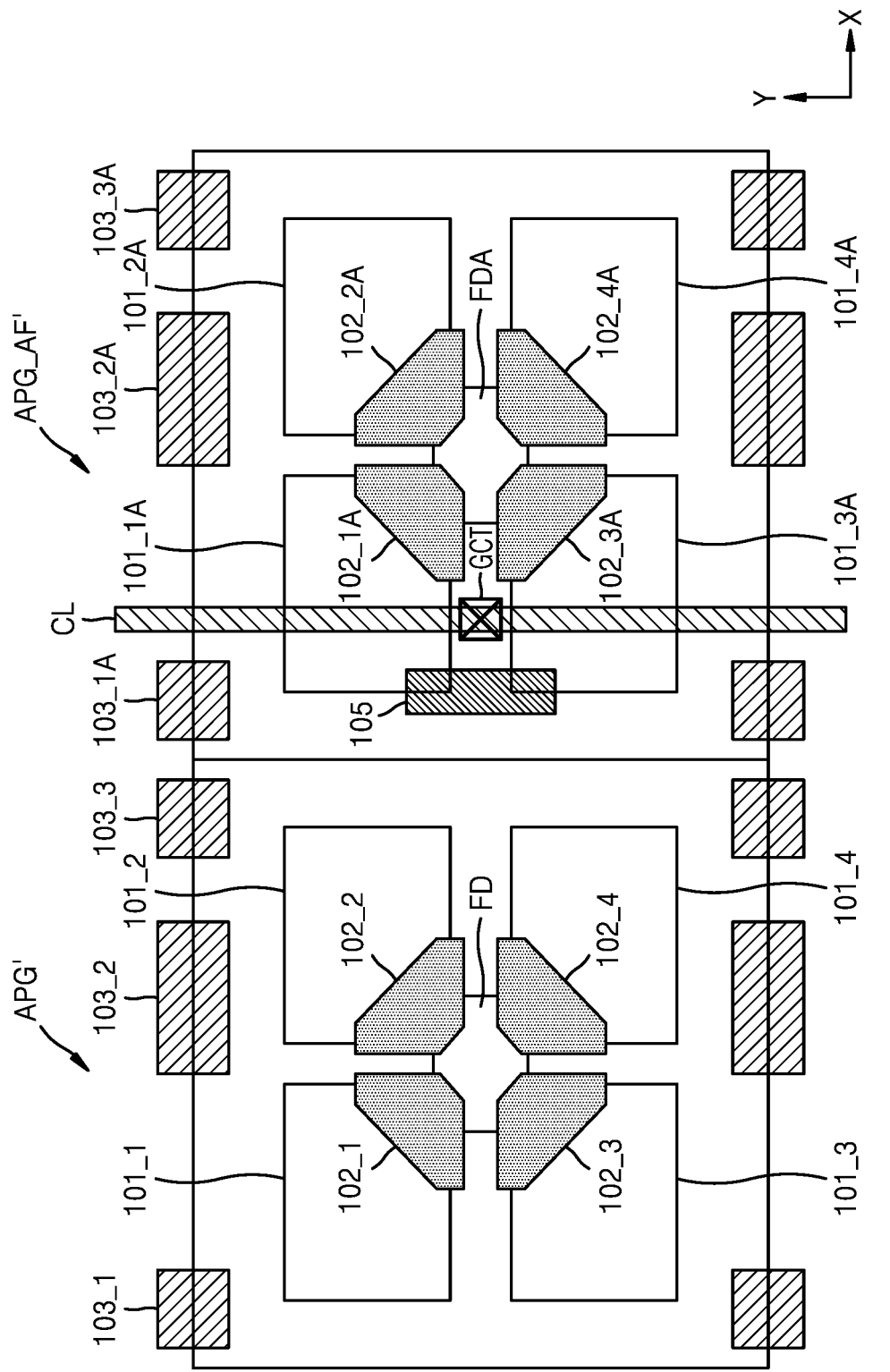
FIG. 11A is an exemplary layout of the first pixel group and the first AF pixel group included in the sixth pixel array of FIG. 9B.
Figure 11B:
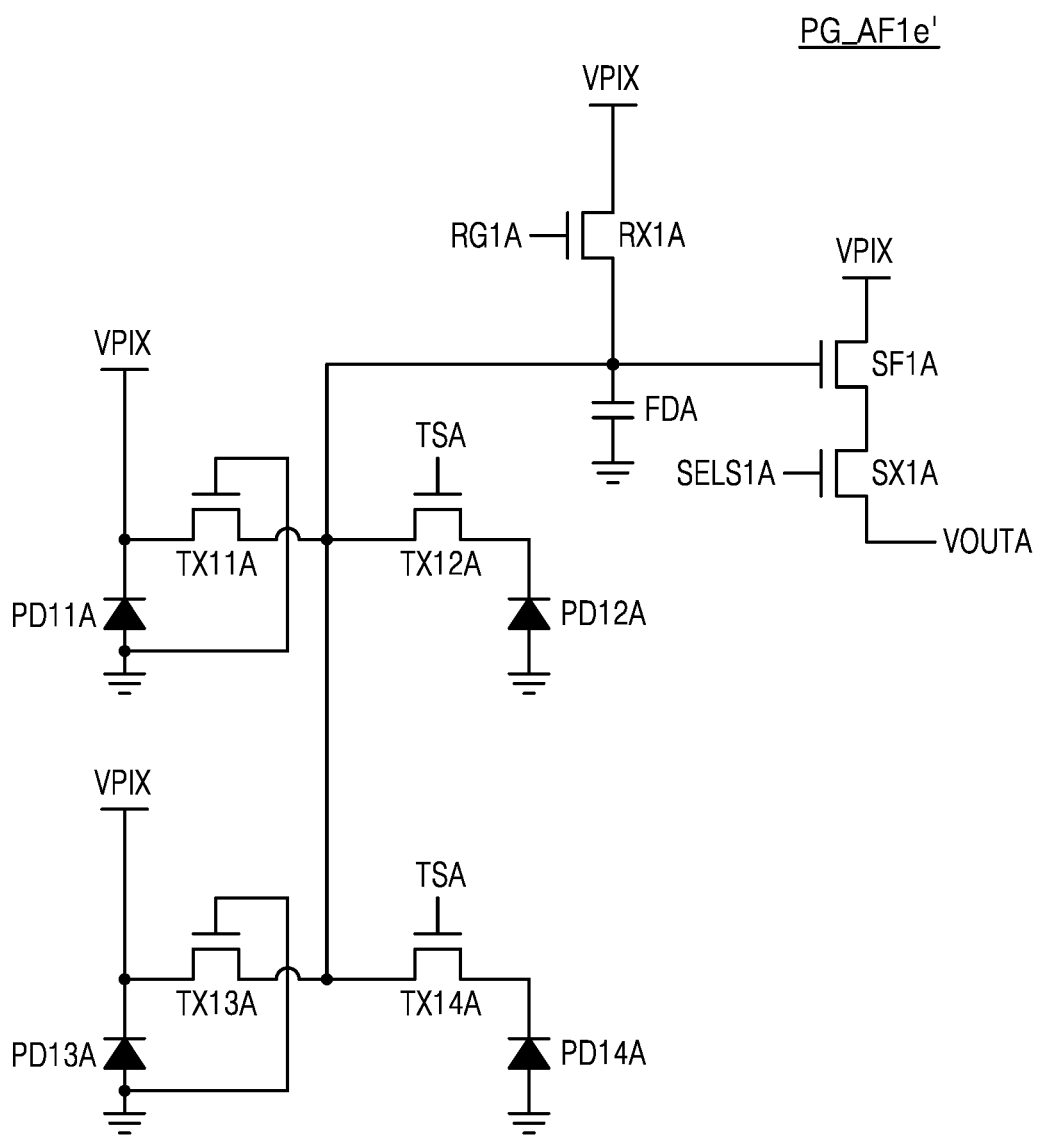
FIG. 11B is another exemplary circuit diagram of the first AF pixel group of FIG. 11A.

FIG. 11A is another exemplary layout of the first pixel group PG1e and the first AF pixel group PG_AF1e included in the sixth pixel array 110_2b of FIG. 9B. FIG. 11B is an exemplary circuit diagram of the first AF pixel group PG_AF1e' of FIG. 11A. In describing FIG. 11A and FIG. 11B, redundant descriptions of the same symbols or components as in FIGS. 10A and 10C may be omitted.

Referring to FIGS. 11A and 11B, a first transmission gate electrode 102_1A may be formed on the first semiconductor layer 101_1A of a first AF pixel group region APG_AF', and a third transmission gate electrode 102_3A may be formed on the third semiconductor layer 101_3A of the first AF pixel group region APG_AF'.

A first pixel and a third pixel of the first AF pixel group PG_AF1e' may respectively include a first transmission transistor TX11A and a third transmission transistor TX13A. The first transmission transistor TX11A may be connected between the first photodiode PD11A and the floating diffusion region PDA, and the third transmission transistor TX13A may be connected to the third photodiode PD13A and the floating diffusion region FDA.

The ground voltage may be applied to the first transmission gate electrode 102_1A of the first transmission transistor TX11A and the third transmission gate electrode 102_3A of the third transmission transistor TX13A. Accordingly, the first transmission transistor TX11A and the third transmission transistor TX13A of the first AF pixel group PG_AF1e' may block connection of the first photodiode PD11A and the third photodiode PD13A to the floating diffusion region FDA.

Figure 12A:
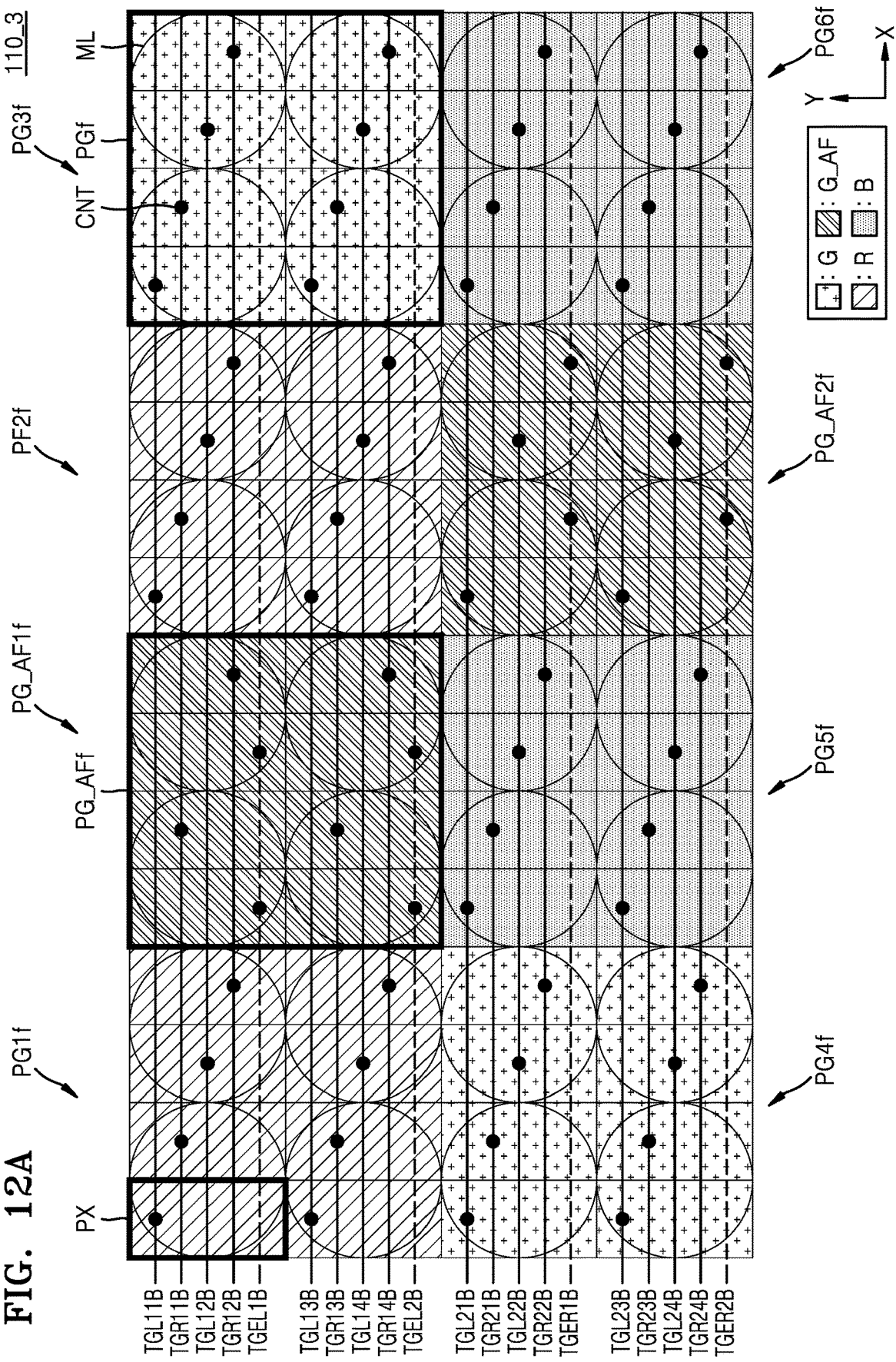
FIGS. 12A through 12C are diagrams illustrating another exemplary connection between the row driver and the pixel array of FIG. 2.
Figure 12B:
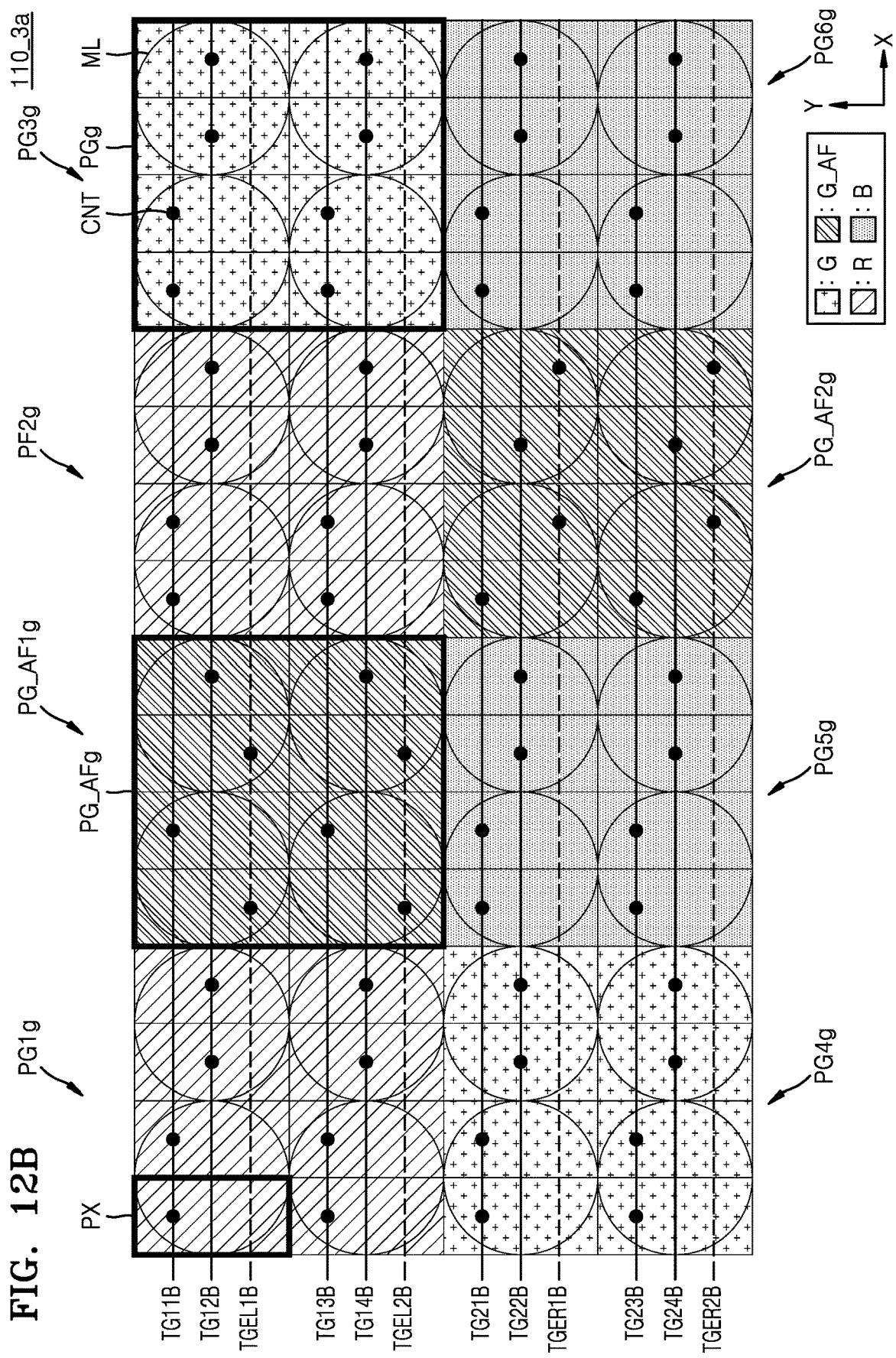
Figure 12C:
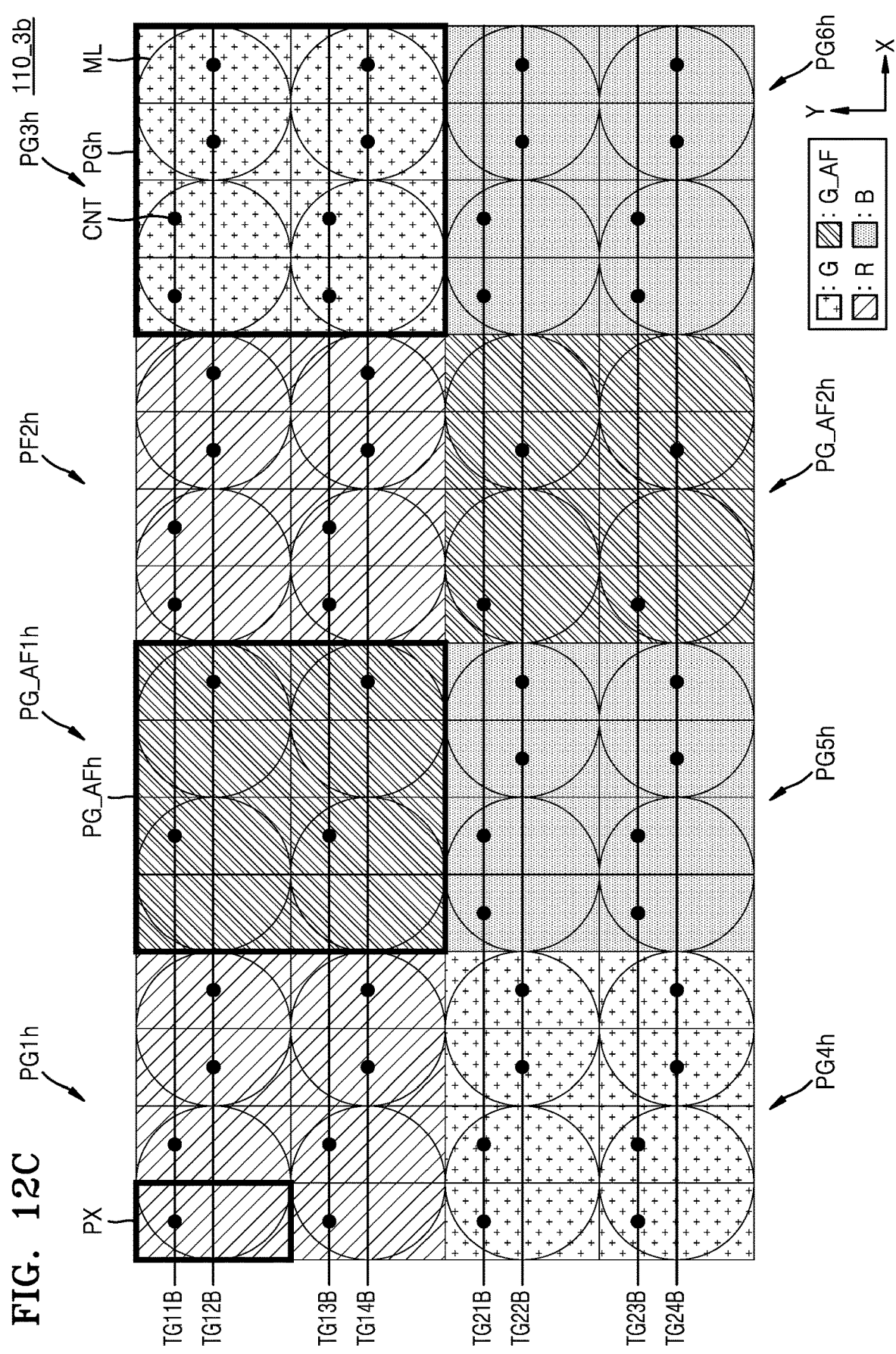

FIGS. 12A to 12C are diagrams illustrating another exemplary connection between the row driver 140 and the pixel array 110 of FIG. 2 and illustrate a part of the pixel array 110 and the transmission control signal lines connected to a part of the pixel array 110. In describing FIGS. 12A to 12C, redundant descriptions of the same symbols or components as in FIG. 3 may be omitted. The pixel array 110 of FIG. 2 may include at least one of seventh to ninth pixel arrays 110_3, 110_3a, and 110_3b.

Referring to FIG. 12A, the seventh pixel array 110_3 may include a plurality of pixel groups PGf and a plurality of AF pixel groups PG_AFf. Each of the plurality of pixel groups PGf may include eight pixels PX arranged in two rows and four columns. Each of the plurality of pixel groups PGf may include four microlenses ML arranged over the plurality of pixels PX. Each of the plurality of pixel groups PG may include a first pixel disposed in a first row and a first column, a second pixel disposed in the first row and a second column, a third pixel disposed in the first row and a third column, a fourth pixel disposed in the first row and a fourth column, a fifth pixel disposed in a second row and the first column, a sixth pixel disposed in the second row and the second column, a seventh pixel disposed in the second row and the third column, and an eighth pixel disposed in the second row and the fourth column. In the present exemplary embodiment, the first to eighth pixels included in the same pixel group among the plurality of pixel groups PGf may share the floating diffusion region.

The first pixels included in the first to third pixel groups PG1f to PG3f may be connected to a first transmission control signal line TGL11B, the second pixels included in the first to third pixel groups PG1f to PG3f may be connected to a second transmission control signal line TGR11B, the third pixels included in the first to third pixel groups PG1f to PG3f may be connected to a third transmission control signal line TGL12B, and the fourth pixels included in the first to third pixel groups PG1f to PG3f may be connected to a fourth transmission control signal line TGR12B. The fifth pixels included in the first to third pixel groups PG1f to PG3f may be connected to a fifth transmission control signal line TGL13B, the sixth pixels included in the first to third pixel groups PG1f to PG3f may be connected to a sixth transmission control signal line TGR13B, the seventh pixels included in the first to third pixel groups PG1f to PG3f may be connected to a seventh transmission control signal line TGL14B, and the eighth pixels included in the first to third pixel groups PG1f to PG3f may be connected to an eighth transmission control signal line TGR14B.

The first pixels included in the fourth to sixth pixel groups PG4f to PG6f may be connected to a ninth transmission control signal line TGL21B, the second pixels included in the fourth to sixth pixel groups PG4f to PG6f may be connected to a tenth transmission control signal line TGR21B, the third pixels included in the fourth to sixth pixel groups PG4f to PG6f may be connected to an eleventh transmission control signal line TGL22B, and the fourth pixels included in the fourth to sixth pixel groups PG4f to PG6f may be connected to a twelfth transmission control signal line TGR22B. The fifth pixels included in the fourth to sixth pixel groups PG4f to PG6f may be connected to a thirteenth transmission control signal line TGL23B, the sixth pixels included in the fourth to sixth pixel groups PG4f to PG6f may be connected to a fourteenth transmission control signal line TGR23B, the seventh pixels included in the fourth to sixth pixel groups PG4f to PG6f may be connected to a fifteenth transmission control signal line TGL24B, and the eighth pixels included in the fourth to sixth pixel groups PG4f to PG6f may be connected to a sixteenth transmission control signal line TGR24B.

Some of the pixels PX included in the plurality of AF pixel groups PG_AFf may be connected to a corresponding transmission control signal line among the transmission control signal lines TGL11B to TGL14B, TGR11B to TGR14B, TGL21B to TGL24B, and TGR21B to TGR24B, and the other of the pixels PX included in the plurality of AF pixel groups PG_AFf may be connected to the corresponding transmission control signal line among the mode control signal lines TGEL1B, TGEL2B, TGER1B, and TGER2B. For example, the first pixel and the third pixel included in the first AF pixel group PG_AF1f may be connected to the first mode control signal line TGEL1B, and the fifth pixel and the seventh pixel included in the first AF pixel group PG_AF1f may be connected to the third mode control signal line. TGEL2B. The second, fourth, sixth, and eighth pixels included in the first AF pixel group PG_AF1f may be respectively connected to the second, fourth, sixth, and eighth transmission control signal lines TGR11B, TGR12B, TGR13B, and TGR14B. In addition, for example, the second pixel and the fourth pixel included in the second AF pixel group PG_AF2f may be connected to the second mode control signal line TGER1B, and the sixth pixel and the eighth pixel included in the second AF pixel group PG_AF2f may be connected to the fourth mode control signal line TGER2B. The first, third, fifth, and seventh pixels included in the second AF pixel group PG_AF2f may be respectively connected to the first, third, fifth, and seventh transmission control signal lines TGL21B, TGL22B, TGL23B, and TGL24B.

In the AF operation of the first mode, the transmission control signals provided through the first, third, fifth, and seventh transmission control signal lines TGL11B, TGL12B, TGL13B, and TGL14B may simultaneously change from a logic low to a logic high. Thereafter, the transmission control signals provided through the second, fourth, sixth, and eighth transmission control signal lines TGR11B, TGR12B, TGR13B, and TGR14B may simultaneously change from the logic low to the logic high. At this time, the first mode control signal and the third mode control signal provided through the first mode control signal line TGEL1B and the third mode control signal line TGEL2B may change from the logic low to the logic high at the same timing as the timing of the first transmission control signal.

In the first mode, the transmission control signals provided through the ninth, eleventh, thirteenth, and fifteenth transmission control signal lines TGL21B, TGL22B, TGL23B, and TGL24B may simultaneously change from the logic low to the logic high. Thereafter, the transmission control signals provided through the tenth, twelfth, fourteenth, and sixteenth transmission control signal lines TGR21B, TGR22B, TGR23B, and TGR24B may simultaneously change from the logic low to the logic high. At this time, the second mode control signal and the fourth mode control signal provided through the second mode control signal line TGER1B and the fourth mode control signal line TGER2B may change from the logic low to the logic high at the same timing as the timing of the tenth transmission control signal provided to the tenth transmission control signal line TGR21B.

Conversely, in the AF operation of the second mode, while the transmission control signals provided through the first to eighth transmission control signal lines TGL11B to TGL14B and TGR11B to TGR14B are changed, the first mode control signal and the third mode control signal provided through the first mode control signal line TGEL1B and the third mode control signal line TGEL2B, respectively, may maintain the logic low. In addition, while the transmission control signals provided through the ninth to sixteenth transmission control signal lines TGL21B to TGL24B and TGR21B to TGR24B are changed, the second mode control signal and the fourth mode control signal provided through the second mode control signal line TGER1B and the third mode control signal line TGER2B, respectively, may maintain the logic low. The image sensor may perform the AF function in the first direction X by using the second pixel signal output from the first AF pixel group PG_AF1f and the first pixel signal output from the second AF pixel group PG_AF2f.

Accordingly, the image sensor may generate AF information by using each of the plurality of pixel groups PGf and the plurality of AF pixel groups PG_AFf by performing the AF operation of the first mode. In addition, the image sensor may generate the AF information by using the plurality of AF pixel groups PG_AFf by performing the AF operation of the second mode and may provide a relatively high speed AF function.

In an exemplary embodiment, when the first transmission control line TGL11B connected to N numbers of pixels PX on a first row in the first direction X, the second transmission control line TGR11B connected to M numbers of pixels PX in the first row in the first direction X, and the first mode control signal line TGEL1B connected to K numbers of pixels PX in the first row in the first direction X, the K may be less than or equal to ⅔ of each of the N and the M. It is understood, however, that one or more other exemplary embodiments are not limited thereto. Referring to FIG. 12B, the eighth pixel array 110_3a may include a plurality of pixel groups PGg and a plurality of AF pixel groups PG_AFg. The plurality of pixels PX included in first to third pixel groups PG1g to PG3g may be connected to the transmission control signal lines TG11B to TG14B. The plurality of pixels PX included in fourth to sixth pixel groups PG4g to PG6g may be connected to the transmission control signal lines TG21B to TG24B.

In the present exemplary embodiment, the pixels PX over which the same microlens ML is formed may be connected to the same transmission control signal line. For example, one microlens ML may be formed over the first pixel and the second pixel of the first pixel group PG1g, and the first pixel and the second pixel may be connected to the same transmission control signal line TG11B.

Some of the pixels PX included in the plurality of AF pixel groups PG_AFg may be connected to a corresponding line among the transmission control signal lines TG11B to TG14B and TG21B to TG24B, and the other of the pixels PX included in the plurality of AF pixel groups PG_AFg may be connected to corresponding lines among the mode control signal lines TGEL1B, TGEL2B, TGER1B, and TGER2B. For example, first, third, fifth, and seventh pixels arranged in the first and third columns among the pixels PX included in the first AF pixel group PG_AF1g may be connected to the first mode control signal line TGEL1B and the third mode control signal line TGEL2B, and second, fourth, sixth, and eighth pixels arranged in the second and fourth columns may be connected to the transmission control signal lines TG11B to TG14B. Alternatively, for example, the first, third, fifth, and seventh pixels arranged in the first and third columns among the pixels PX included in the second AF pixel group PG_AF2g may be connected to the transmission control signal lines TG21B to TG24B, and the second, fourth, sixth, and eighth pixels arranged in the second and fourth columns may be connected to the second mode control signal line TGER1B and the fourth mode control signal line TGER2B.

In the AF operation of the second mode, the first mode control signal and the third mode control signal provided to the first mode control signal line TGEL1B and the third mode control signal line TGEL2B may maintain a logic low. In addition, the second mode control signal and the fourth mode control signal provided to the second mode control signal line TGER1B and the fourth mode control signal line TGER2B may maintain the logic low.

In an exemplary embodiment, when the transmission control line TG11B connected to N numbers of pixels PX on a first row in the first direction X, and the first mode control signal line TGEL1B connected to K numbers of pixels PX in the first row in the first direction X, the K may be less than or equal to ⅔ of the N. It is understood, however, that one or more other exemplary embodiments are not limited thereto.

Referring to FIG. 12C, the ninth pixel array 110_3b may include a plurality of pixel groups PGh and a plurality of AF pixel groups PG_AFh. The plurality of pixels PX included in the plurality of pixel groups PGh may be connected to corresponding lines among the transmission control signal lines TG11B to TG14B and TG21B to TG24B. Some of the pixels PX included in the plurality of AF pixel groups PG_AFh may be connected to a corresponding line among the transmission control signal lines TG11B to TG14B and TG21B to TG24B, and the other of the pixels PX included in the plurality of AF pixel groups PG_AFh may not be connected to the transmission control signal lines TG11B to TG14B and TG21B to TG24B. For example, the pixel PX not connected to the transmission control signal lines TG11B to TG14B and TG21B to TG24B may not include the transmission transistor or may not apply the ground voltage to a gate electrode of the transmission transistor.

Figure 13A:
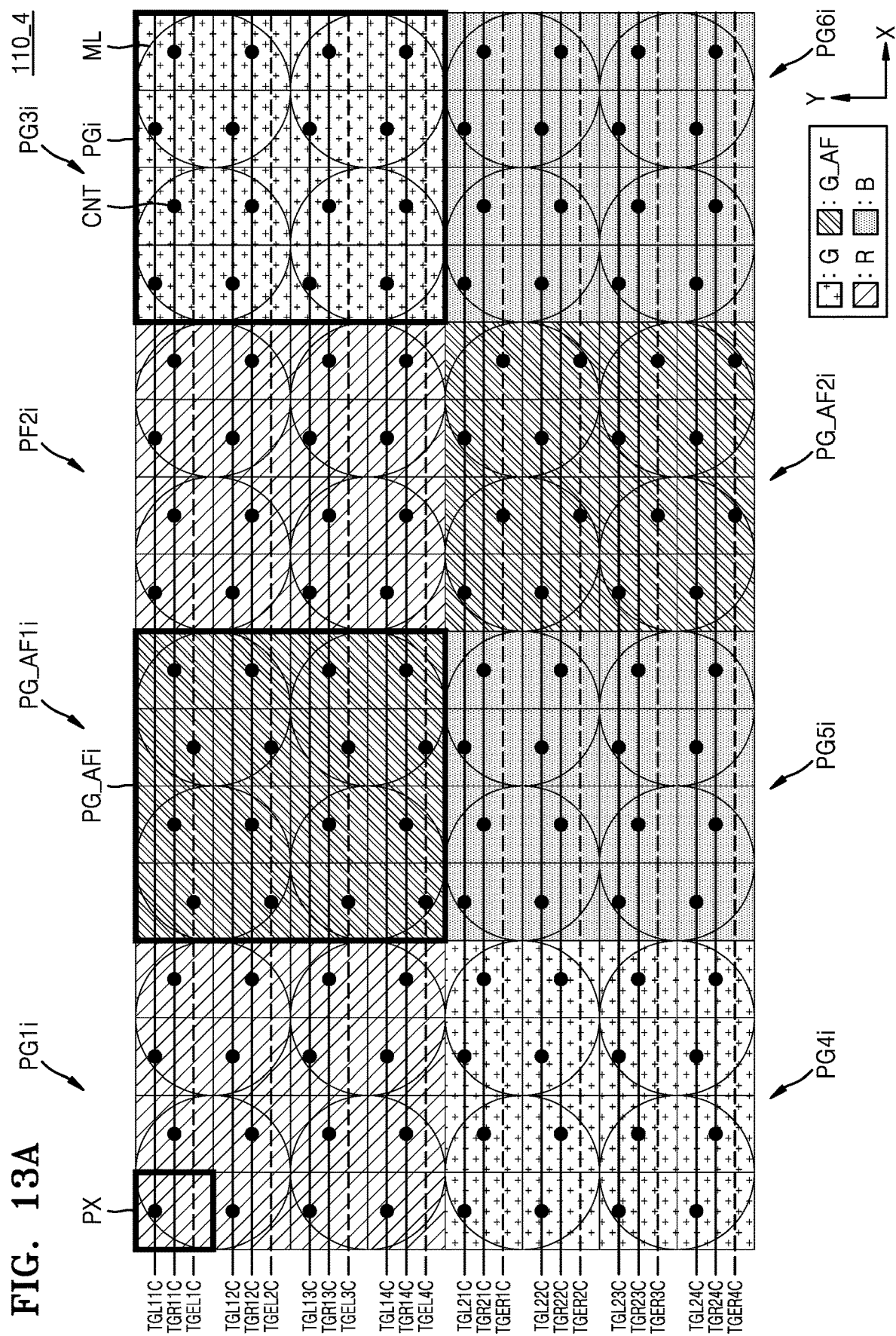
FIGS. 13A to 13C are diagrams illustrating another exemplary connection between the row driver and the pixel array of FIG. 2.
Figure 13B:
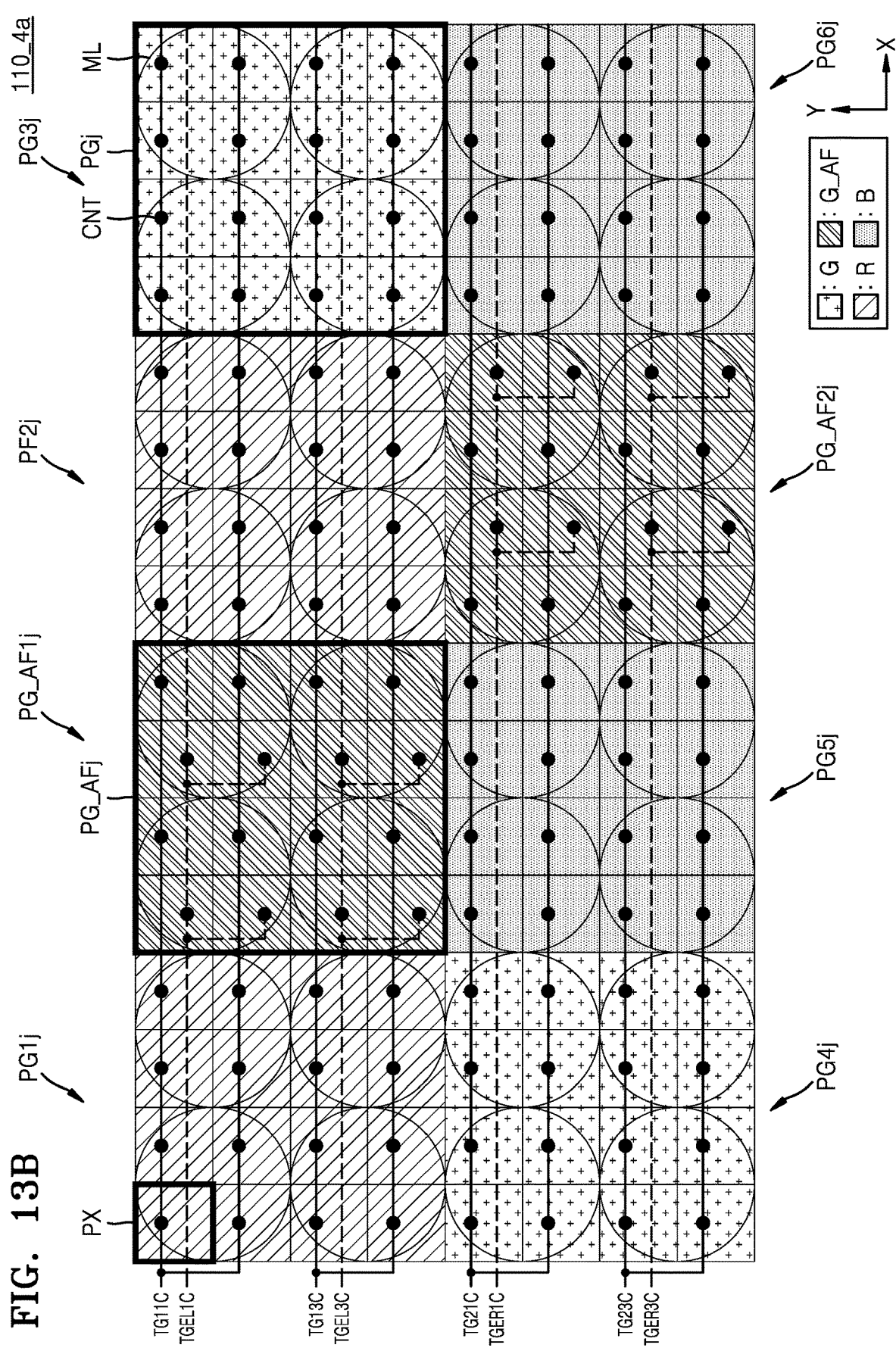
Figure 13C:
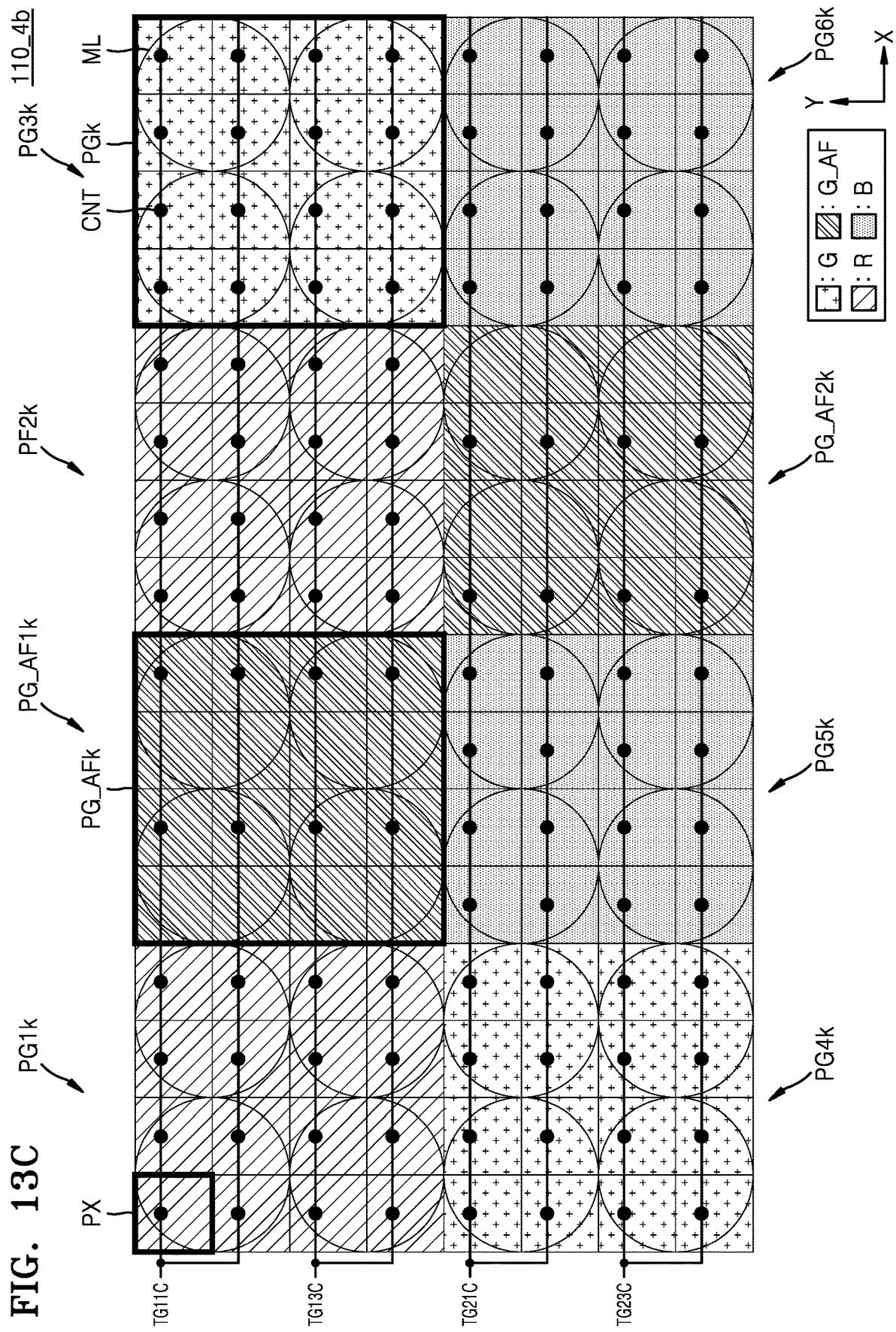

FIGS. 13A to 13C are diagrams illustrating another exemplary connection between the row driver 140 and the pixel array 110 of FIG. 2 and illustrate a part of the pixel array 110 and the transmission control signal lines connected to a portion of the pixel array 110. In describing FIGS. 13A to 13C, redundant descriptions of the same symbols or components as in FIG. 3 may be omitted. The pixel array 110 of FIG. 2 may include at least one of tenth to twelfth pixel arrays 110_4, 110_4a, and 110_4b.

Referring to FIG. 13A, the seventh pixel array 110_4 may include a plurality of pixel groups PGi and a plurality of AF pixel groups PG_AFi. Each of the plurality of pixel groups PGi may include sixteen pixels PX arranged in four rows and four columns Each of the plurality of pixel groups PGi may include four microlenses ML arranged over the plurality of pixels PX. One microlens ML may be disposed over four pixels PX arranged adjacent to each other among the plurality of pixels PX included in one pixel group. The microlenses ML included in the seventh pixel array 110_4 may have the same shape and a constant size. In the present exemplary embodiment, the pixels PX included in the same pixel group among the plurality of pixel groups PG may share the floating diffusion region.

The pixels PX included in first to third pixel groups PG1i to PG3i may be connected to corresponding lines among transmission control signal lines TGL11C to TGL14C and TGR11C to TGR14C. The pixels PX included in fourth to sixth pixel groups PG4i to PG6i may be connected to corresponding lines among transmission control signal lines TGL21C to TGL24C and TGR21C to TGR24C.

Some of the pixels PX included in the plurality of AF pixel groups PG_AFi may be connected to a corresponding line among the transmission control signal lines TGL11C to TGL14C, TGR11C to TGR14C, TGL21C to TGL24C, and TGR21C to TGR24C, and the other of the pixels PX included in the plurality of AF pixel groups PG_AFi may be connected to corresponding lines among the mode control signal lines TGEL1C to TGEL4C and TGER1C to TGER4C. For example, the pixels PX arranged in the first and third columns of the first AF pixel group PG_AF1i may be connected to the mode control signal lines TGEL1C to TGEL4C, and the pixels PX arranged in the second and fourth columns of the first AF pixel group PG_AF1i may be connected to the transmission control signal lines TGR11C to TGR14C. In addition, for example, the pixels PX arranged in the first and third columns of the second AF pixel group PG_AF2i may be connected to the transmission control signal lines TGL21C to TGL24C, and the pixels PX arranged in the second and fourth columns of the second AF pixel group PG_AF2i may be connected to the mode control signal lines TGER1C to TGER4C.

In the AF operation of the first mode, the transmission control signals provided through the first, third, fifth, and seventh transmission control signal lines TGL11C, TGL12C, TGL13C, and TGL14C may simultaneously change from a logic low to a logic high. Thereafter, the transmission control signals provided through the second, fourth, sixth, and eighth transmission control signal lines TGR11C, TGR12C, TGR13C, and TGR14C may simultaneously change from the logic low to the logic high. At this time, the mode control signals provided through the mode control signal lines TGEL1C, TGEL2C, TGEL3C, and TGEL4C may change from the logic low to the logic high at the same timing as the timing of the first transmission control signal provided to the first transmission control signal line TGL11C and may be activated at the same timing as the timing of the first transmission control signal provided to the first transmission control signal line TGL11C.

In the first mode, the transmission control signals provided through the ninth, eleventh, thirteenth, and fifteenth transmission control signal lines TGL21C, TGL22C, TGL23C, and TGL24C may simultaneously change from the logic low to the logic high. Thereafter, the transmission control signals provided through the tenth, twelfth, fourteenth, and sixteenth transmission control signal lines TGR21C, TGR22C, TGR23C, and TGR24C may simultaneously change from the logic low to the logic high. At this time, the mode control signals provided through the mode control signal lines TGER1C, TGER2C, TGER3C, and TGER4C may change from the logic low to the logic high at the same timing as the timing of the tenth transmission control signal provided to the tenth transmission control signal line TGR21C.

Conversely, in the AF operation of the second mode, the transmission control signals provided through the first to eighth transmission control signal lines TGL11C to TGL14C and TGR11C to TGR14C may simultaneously change from the logic low to the logic high. At this time, the mode control signals provided through the mode control signal lines TGEL1C to TGEL4C may maintain the logic low. In addition, the transmission control signals provided through the ninth through sixteenth transmission control signal lines TGL21C to TGL24C and TGR21C to TGR24C may simultaneously change from the logic low to the logic high. At this time, the mode control signals provided through the mode control signal lines TGER1C to TGER4C may maintain the logic low.

In the second mode, the image sensor may perform the AF function in the direction X by using the second pixel signal output from the first AF pixel group PG_AF1$i$ and the first pixel signal output from the second AF pixel group PG_AF2$i$. Accordingly, the image sensor may provide a relatively high speed AF function by performing the AF operation of the second mode.

In an exemplary embodiment, when the first transmission control line TGL11C connected to N numbers of pixels PX on a first row in the first direction X, the second transmission control line TGR11C connected to M numbers of pixels PX in the first row in the first direction X, and the first mode control signal line TGEL1C connected to K numbers of pixels PX in the first row in the first direction X, the K may be less than or equal to ⅓ of each of the N and the M. It is understood, however, that one or more other exemplary embodiments are not limited thereto.

Referring to FIG. 13B, the eleventh pixel array 110_4$a$ may include a plurality of pixel groups PG$j$ and a plurality of AF pixel groups PG_AF$j$. The plurality of pixels PX included in first to third pixel groups PG1$j$ to PG3$j$ may be connected to transmission control signal lines TG11C and TG13C. The plurality of pixels PX included in fourth to sixth pixel groups PG4$j$ to PG6$j$ may be connected to transmission control signal lines TG21C and TG23C.

In the present exemplary embodiment, the pixels PX over which the same microlens ML is formed may be connected to the same transmission control signal line. For example, one microlens ML may be formed over the first to fourth pixels arranged in the first and second rows and the first and second columns of the first pixel group PG1$j$ and may be connected to the same transmission control signal line TG11C.

Some of the pixels PX included in the plurality of AF pixel groups PG_AF$j$ may be connected to a corresponding line among the transmission control signal lines TG11C, TG13C, TG21C, and TG23C, and the other of the pixels PX included in the plurality of AF pixel groups PG_AF$j$ may be connected to corresponding lines among the mode control signal lines TGEL1C, TGEL2C, TGER1C, and TGER2C. For example, the pixels arranged in the first and third columns among the pixels PX included in the first AF pixel group PG_AF1$j$ may be connected to the mode control signal lines TGEL1C and TGEL3C, and the pixels arranged in the second and fourth columns may be connected to the transmission control signal lines TG11C and TG13C. For example, the pixels arranged in the first and third columns among the pixels PX included in the second AF pixel group PG_AF2$j$ may be connected to the transmission control signal lines TG21C and TG23C, and the pixels arranged in the second and fourth columns may be connected to the mode control signal lines TGER1C and TGER3C and the fourth mode control signal line TGER2C.

In the AF operation of the second mode, the mode control signals provided through the mode control signal lines TGEL1C and TGEL3C connected to the first AF pixel group PG_AF1$j$ may maintain a logic low. In addition, the mode control signals provided through the mode control signal lines TGER1C and TGER3C connected to the second AF pixel group PG_AF2$j$ may maintain the logic low.

In an exemplary embodiment, when the transmission control line TG11C connected to N numbers of pixels PX on a first row in the first direction X, and the first mode control signal line TGEL1C connected to K numbers of pixels PX in the first row in the first direction X, the K may be less than or equal to ⅓ of the N. It is understood, however, that one or more other exemplary embodiments are not limited thereto.

Referring to FIG. 13C, the twelfth pixel array 110_4$b$ may include a plurality of pixel groups PG$k$ and a plurality of AF pixel groups PG_AF$k$. The plurality of pixels PX included in the plurality of pixel groups PG$k$ may be connected to a corresponding line among the transmission control signal lines TG11C, TG13C, TG21C, and TG23C. Some of the pixels PX included in the plurality of AF pixel groups PG_AF$k$ may be connected to a corresponding line among the transmission control signal lines TG11C, TG13C, TG21C, and TG23C, and the other of the pixels PX included in the plurality of AF pixel groups PG_AF$k$ may not be connected to the transmission control signal lines TG11C, TG13C, TG21C, and TG23C. For example, the pixel PX not connected to the transmission control signal lines TG11C, TG13C, TG21C, and TG23C may not include a transmission transistor, or the ground voltage may be applied to a gate electrode of the transfer transistor.

While the inventive concept(s) has been particularly shown and described with reference to exemplary embodiments above, it will be understood that various changes in form and details may be made therein without departing from the spirit and scope as embodied in at least the following claims.

What is claimed is:

1. An image sensor comprising:
   a pixel array including a plurality of image pixel groups and an auto focusing (AF) pixel group disposed in a same row, each of the plurality of image pixel groups and the AF pixel group including a plurality of pixels; and
   a plurality of transmission control signal line and a plurality of mode control signal lines transmitting transmission control signals to the pixel array,
   wherein each of the plurality of image pixel groups and the AF pixel group includes eight pixels,
   wherein two pixels included in the AF pixel group are connected to a first mode control signal line,
   wherein other two pixels included in the AF pixel group are connected to a second mode control signal line,
   wherein each of the two pixels and the other two pixels included in the AF pixel group is connected to different transmission control signal lines.

2. The image sensor of claim 1, further comprising;
   a plurality of micro lenses disposed on each of the plurality of image pixel groups and the AF pixel group,
   each of the plurality of micro lenses is disposed to correspond to two adjacent pixels.

3. The image sensor of claim 2, wherein
   the two pixels corresponding to one micro lens are configured to share a floating diffusion area.

4. The image sensor of claim 1, wherein
   each of the eight pixels included in each of the plurality of image pixel groups is connected to eight transmission control signal lines one by one,
   each of the two pixels and the other two pixels included in the AF pixel group is configured to be connected to four transmission control signal lines of the eight transmission control signal lines one by one.

5. The image sensor of claim 4, wherein
   in a first mode, transmission control signals transmitted through the eight transmission control signal lines, the first mode control signal line and the second mode control signal line are activated, and in a second mode, transmission control signals transmitted through the first mode control signal line and the second mode control signal line are deactivated.

6. The image sensor of claim 1, wherein
the eight pixels included in each of the plurality of image pixel groups are connected to four transmission control signal lines by two,
each of the two pixels and the other two pixels included in the AF pixel group is configured to be connected to the four transmission control signal lines one by one.

7. The image sensor of claim 6, wherein
in a first mode, transmission control signals transmitted through the four transmission control signal lines, the first mode control signal line and the second mode control signal line are activated, and
in a second mode, transmission control signals transmitted through the first mode control signal line and the second mode control signal line are deactivated.

8. The image sensor of claim 6, wherein
the two pixels connected to one transmission control signal line are adjacent to each other.

9. An image sensor comprising:
a pixel array including a plurality of image pixel groups and an auto focusing (AF) pixel group disposed in a same row, each of the plurality of image pixel groups and the AF pixel group including a plurality of pixels; and
eight of transmission control signal lines and four of mode control signal lines transmitting transmission control signals to the pixel array,
wherein each of the plurality of image pixel groups and the AF pixel group includes sixteen pixels,
wherein the sixteen pixels included in each of the plurality of image pixel groups are connected to each of the eight transmission control signal lines by two,
wherein eight pixels included in the AF pixel group are connected to each of the four mode control signal lines by two,
wherein each of other eight pixels included in the AF pixel group are configured to be connected to one of the eight transmission control signal lines.

10. The image sensor of claim 9, wherein
in a first mode, transmission control signals transmitted through the eight transmission control signal lines and the four mode control signal lines are activated, and
in a second mode, transmission control signals transmitted through the four mode control signal lines are deactivated.

11. The image sensor of claim 9, wherein
two adjacent pixels among the 16 pixels included in each of the plurality of image pixel groups are connected to different control transmission signal lines.

12. The image sensor of claim 9, wherein
the other eight pixels included in the AF pixel group are connected to each of four transmission control signal lines among the eight transmission control signal lines by two.

13. The image sensor of claim 12, wherein
among the other eight pixels included in the AF pixel group, two pixels connected to each of the four transmission control signal lines are not adjacent to each other.

14. The image sensor of claim 9, wherein
the sixteen pixels included in each of the plurality of image pixel groups and the AF pixel group share a floating diffusion area with each other.

15. An image sensor comprising:
a pixel array including a plurality of image pixel groups and an auto focusing (AF) pixel group disposed in a same row, each of the plurality of image pixel groups and the AF pixel group including a plurality of pixels; and
a first transmission control signal line, a second transmission control signal line, a first mode control signal line and a second mode control signal line transmitting transmission control signals to the pixel array,
wherein each of the plurality of image pixel groups and the AF pixel group includes sixteen pixels,
wherein the sixteen pixels included in each of the plurality of image pixel groups are connected to each of the first transmission control signal line and the second transmission control signal line by eight,
wherein eight pixels included in the AF pixel group are connected to each of the first mode control signal line and the second mode control signal line by four,
wherein each of other eight pixels included in the AF pixel group are connected to each of the first transmission control signal line and the second transmission control signal line by four.

16. The image sensor of claim 15, wherein
in a first mode, transmission control signals transmitted through the first transmission control signal line, the second transmission control signal line, the first mode control signal line and the second mode control signal line are activated, and
in a second mode, transmission control signals transmitted through the first mode control signal line and the second mode control signal line are deactivated.

17. The image sensor of claim 15, wherein
a plurality of micro lenses disposed on each of the plurality of image pixel groups and the AF pixel group, p1 four pixels corresponding to one microlens among 16 pixels included in the same image pixel group are connected to the same transmission control signal line.

18. The image sensor of claim 15, wherein
two adjacent pixels included in the AF pixel group and located in the same column are connected to the same mode control signal line.

19. The image sensor of claim 15, wherein
two adjacent pixels included in the AF pixel group and located in the same column are connected to the same transmission control signal line.

20. The image sensor of claim 15, wherein
two adjacent pixels included in the AF pixel group and located in the same row are connected to each of the first mode control signal line and the first transmission control signal line one by one.

* * * * *